US011028205B2

(12) United States Patent
Ely et al.

(10) Patent No.: US 11,028,205 B2
(45) Date of Patent: Jun. 8, 2021

(54) WATER-BREAKABLE FORMULATIONS AND ADDITIVE MANUFACTURING PROCESSES EMPLOYING SAME

(71) Applicant: Stratasys Ltd., Rehovot (IL)

(72) Inventors: Tal Ely, Ramat-Gan (IL); Mariana Pokrass, Rehovot (IL); Dani Peri, Rehovot (IL); Avraham Levy, Petach-Tikva (IL); Dana Tenne, Ramot-HaShavim (IL)

(73) Assignee: Stratasys Ltd., Rehovot (IL)

( * ) Notice: Subject to any disclaimer, the term of this patent is extended or adjusted under 35 U.S.C. 154(b) by 217 days.

(21) Appl. No.: 16/070,280

(22) PCT Filed: Jan. 15, 2017

(86) PCT No.: PCT/IL2017/050046
§ 371 (c)(1),
(2) Date: Jul. 15, 2018

(87) PCT Pub. No.: WO2017/122211
PCT Pub. Date: Jul. 20, 2017

(65) Prior Publication Data
US 2019/0010270 A1  Jan. 10, 2019

Related U.S. Application Data

(60) Provisional application No. 62/279,002, filed on Jan. 15, 2016.

(51) Int. Cl.
*C08F 222/22* (2006.01)
*B33Y 70/00* (2020.01)
(Continued)

(52) U.S. Cl.
CPC .......... *C08F 222/22* (2013.01); *B29C 64/112* (2017.08); *B29C 64/40* (2017.08);
(Continued)

(58) Field of Classification Search
CPC ...... C08F 222/22; C08F 222/20; B33Y 70/00; B33Y 10/00; B33Y 40/00; G03F 7/027;
(Continued)

(56) References Cited

U.S. PATENT DOCUMENTS 6,569,373 B2 * 5/2003 Napadensky .......... B41M 3/006
264/401
6,659,373 B1 * 12/2003 Heren ................... B05B 1/3013
239/391

(Continued)

FOREIGN PATENT DOCUMENTS

EP  1741545  1/2007
EP  3268809  1/2018
(Continued)

OTHER PUBLICATIONS

Supplementary European Search Report and the European Search Opinion dated Jul. 15, 2019 From the European Patent Office Re. Application No. 17738294.2. (10 Pages).
(Continued)

*Primary Examiner* — Michael Bernshteyn

(57) ABSTRACT

Curable formulations which form cured materials that are breakable upon immersion in water are disclosed. The cured materials break into a plurality of particles being a few millimeters or less in size. Methods of fabricating three-dimensional objects utilizing the curable formulations are also disclosed, as well as model objects fabricated thereby. The curable formulations include at least a mono-functional curable material and a multi-functional curable material, as described in the specification.

Figure 1:
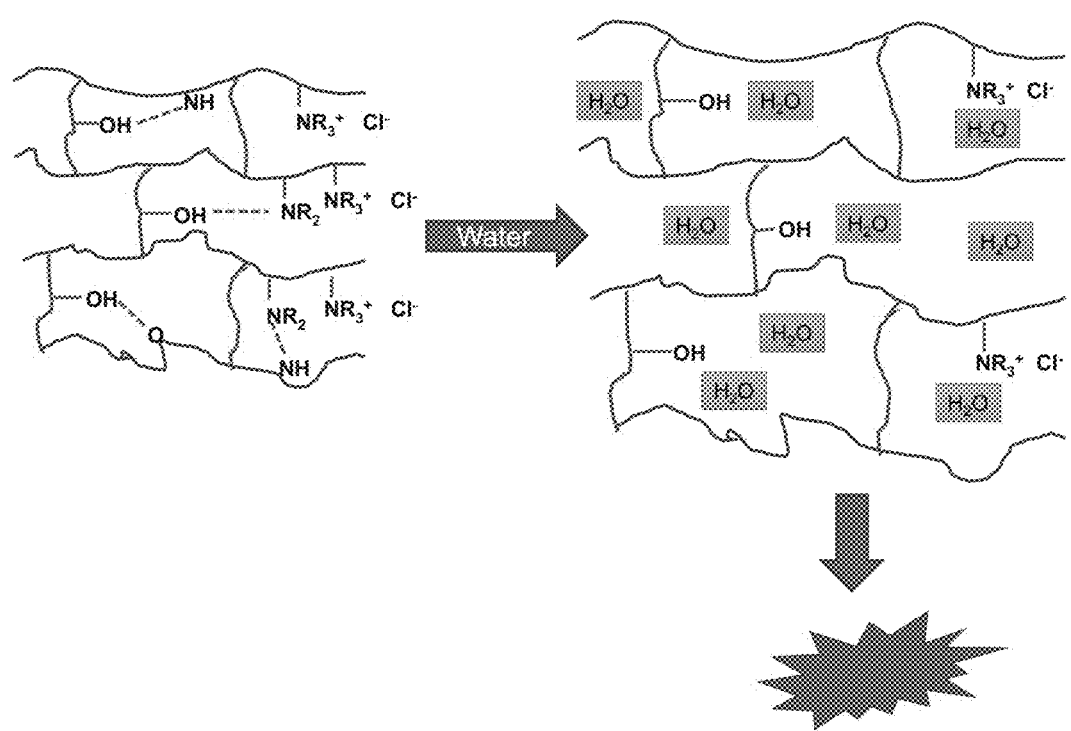

22 Claims, 5 Drawing Sheets
(5 of 5 Drawing Sheet(s) Filed in Color)

(51) Int. Cl.
  *G03F 7/027* (2006.01)
  *G03F 7/00* (2006.01)
  *G03F 7/038* (2006.01)
  *B33Y 40/00* (2020.01)
  *B29C 64/112* (2017.01)
  *B29C 64/40* (2017.01)
  *C08F 222/20* (2006.01)
  *B33Y 10/00* (2015.01)
  *B29K 33/00* (2006.01)

(52) U.S. Cl.
  CPC .............. *B33Y 40/00* (2014.12); *B33Y 70/00* (2014.12); *C08F 222/20* (2013.01); *G03F 7/0037* (2013.01); *G03F 7/027* (2013.01); *G03F 7/038* (2013.01); *B29K 2033/08* (2013.01); *B33Y 10/00* (2014.12)

(58) Field of Classification Search
  CPC ..... G03F 7/0037; G03F 7/038; B29C 64/112; B29C 64/40
  USPC ....................................... 526/323.2
  See application file for complete search history.

(56) References Cited

U.S. PATENT DOCUMENTS

| | | | | |
|---|---|---|---|---|
| 6,685,869 B2* | 2/2004 | Yamamura | ............ | G03F 7/0037 264/401 |
| 7,183,335 B2* | 2/2007 | Napadensky | ............ | C08G 2/00 522/71 |
| 7,479,510 B2* | 1/2009 | Napadensky | ......... | B29C 64/112 522/75 |
| 8,801,418 B2* | 8/2014 | El-Siblani | ............... | B29C 64/40 425/174.4 |
| 9,790,382 B2* | 10/2017 | Suzuki | .................... | B29C 64/35 |
| 2003/0207959 A1* | 11/2003 | Napadensky | .......... | B41M 3/006 522/183 |
| 2004/0187714 A1 | 9/2004 | Napadensky et al. | | |
| 2007/0168815 A1* | 7/2007 | Napadensky | ......... | B29C 64/112 714/738 |
| 2010/0256255 A1 | 10/2010 | Stevens | | |
| 2013/0073068 A1 | 3/2013 | Napadensky | | |
| 2013/0234370 A1 | 9/2013 | Suzuki et al. | | |
| 2015/0129798 A1 | 5/2015 | Napadensky | | |
| 2016/0263826 A1* | 9/2016 | Suzuki | ................... | B29C 64/40 |

FOREIGN PATENT DOCUMENTS

| | | |
|---|---|---|
| EP | 3334590 | 6/2018 |
| JP | 2012-111226 | 6/2012 |
| JP | 2015-227057 | 12/2015 |
| WO | WO 2015/118552 | 8/2015 |
| WO | WO 2017/029657 | 2/2017 |
| WO | WO 2017/122211 | 7/2017 |

OTHER PUBLICATIONS

Notification of Office Action and Search Report dated Dec. 18, 2019 From the State Intellectual Property Office of the People's Republic of China Re. Application No. 201780011137.9 and Its Translation of Office Action Into English. (11 Pages).
International Preliminary Report on Patentability dated Jul. 26, 2018 From the International Bureau of WIPO Re. Application No. PCT/IL2017/050046. (8 Pages).
International Search Report and the Written Opinion dated Apr. 6, 2017 From the International Searching Authority Re. Application No. PCT/IL2017/050046. (14 Pages).
Notification of Office Action dated Aug. 17, 2020 From the State Intellectual Property Office of the People's Republic of China Re. Application No. 201780011137.9. (3 Pages).
Translation Dated Aug. 28, 2020 of Notification of Office Action dated Aug. 17, 2020 From the State Intellectual Property Office of the People's Republic of China Re. Application No. 201780011137.9. (2 Pages).

\* cited by examiner

WATER-BREAKABLE FORMULATIONS AND ADDITIVE MANUFACTURING PROCESSES EMPLOYING SAME

RELATED APPLICATIONS

This application is a National Phase of PCT Patent Application No. PCT/IL2017/050046 having International filing date of Jan. 15, 2017, which claims the benefit of priority under 35 USC § 119(e) of U.S. Provisional Patent Application No. 62/279,002 filed on Jan. 15, 2016. The contents of the above applications are all incorporated by reference as if fully set forth herein in their entirety.

FIELD AND BACKGROUND OF THE INVENTION

The present invention, in some embodiments thereof, relates to additive manufacturing (AM), and more particularly, but not exclusively, to water-breakable formulations useful in additive manufacturing such as three-dimensional inkjet printing, and to methods of additive manufacturing utilizing same.

Additive manufacturing (AM) is a technology enabling fabrication of arbitrarily shaped structures directly from computer data via additive formation steps (additive manufacturing; AM). The basic operation of any AM system consists of slicing a three-dimensional computer model into thin cross sections, translating the result into two-dimensional position data and feeding the data to control equipment which fabricates a three-dimensional structure in a layerwise manner.

Additive manufacturing entails many different approaches to the method of fabrication, including three-dimensional printing such as 3D inkjet printing, electron beam melting, stereolithography, selective laser sintering, laminated object manufacturing, fused deposition modeling and others.

Three-dimensional (3D) printing processes, for example, 3D inkjet printing, are being performed by a layer by layer inkjet deposition of building materials. Thus, a building material is dispensed from a dispensing head having a set of nozzles to deposit layers on a supporting structure. Depending on the building material, the layers may then be cured or solidified using a suitable technique.

Various three-dimensional printing techniques exist and are disclosed in, e.g., U.S. Pat. Nos. 6,259,962, 6,569,373, 6,658,314, 6,850,334, 6,863,859, 7,183,335, 7,209,797, 7,225,045, 7,300,619, and 7,500,846 and U.S. patent application having Publication No. 20130073068, all by the same Assignee.

During the additive manufacturing (AM) process, the building material may include "model material" (also known as "object material" or "modeling material"), which is deposited to produce the desired object, and frequently, another material ("support material" or "supporting material") is used to provide temporary support to the object as it is being built. The other material is referred to herein and in the art as "support material" or "supporting material", and is used to support specific areas of the object during building and for assuring adequate vertical placement of subsequent object layers. For example, in cases where objects include overhanging features or shapes, e.g. curved geometries, negative angles, voids, and the like, objects are typically constructed using adjacent support constructions, which are used during the printing and then subsequently removed in order to reveal the final shape of the fabricated object.

Formulations for providing the model material and the support material, referred to as building material formulations or simply as building formulations, may be initially liquid and subsequently hardened to form the required layer shape. The hardening process may be performed by a variety of techniques, such as UV curing, phase change, crystallization, drying, etc. In all cases, the support material is deposited in proximity of the model material, enabling the formation of complex object geometries and filling of object voids. In such cases, the removal of the hardened support material is liable to be difficult and time consuming, and may damage the formed object.

When using currently available commercial print heads, such as ink-jet printing heads, the building material formulations (the model formulation and support formulation) should have a relatively low viscosity (about 10-20 cPs) at the working, i.e., jetting, temperature, such that it can be jetted. Further, the model and support material formulations should harden (e.g., cure) rapidly in order to allow building of subsequent layers. Additionally, the hardened support material should have sufficient mechanical strength for holding the model material in place, and low distortion for avoiding geometrical defects.

Known methods for removal of support materials include mechanical impact, which is typically applied by a tool or water-jet, as well as chemical methods, such as dissolution in a solvent, with or without heating. The mechanical methods are labor, intensive and are often unsuited for small intricate parts.

For dissolving the support materials, the fabricated object is often immersed in water or in a solvent that is capable of dissolving the support materials. The solutions utilized for dissolving the support material are also referred to herein and in the art as "cleaning solutions". In many cases, however, the support removal process may involve hazardous materials, manual labor and/or special equipment requiring trained personnel, protective clothing and expensive waste disposal. In addition, the dissolution process is usually limited by diffusion kinetics and may require very long periods of time, especially when the support constructions are large and bulky. Furthermore, post-processing may be necessary to remove traces of a 'mix layer' on object surfaces. The term "mix layer" refers to a residual layer of mixed hardened model and support materials formed at the interface between the two materials on the surfaces of the object being fabricated, by model and support materials mixing into each other at the interface between them.

Both mechanical and dissolution methods for removal of support materials are especially problematic for use in an office environment, where ease-of-use, cleanliness and environmental safety are major considerations.

Water-soluble materials for 3D building have been previously described. U.S. Pat. No. 6,228,923, for example, describes a water soluble thermoplastic polymer—Poly(2-ethyl-2-oxazoline)—for use as a support material in a 3D building process involving high pressure and high temperature extrusion of ribbons of selected materials onto a plate.

A water-containing support material comprising a fusible crystal hydrate is described in U.S. Pat. No. 7,255,825.

Compositions suitable for support in building a 3D object are described, for example, in U.S. Pat. Nos. 7,479,510, 7,183,335 and 6,569,373, all to the present Assignee. Generally, the compositions disclosed in these patents comprise at least one UV curable (reactive) component, e.g., an acrylic component, at least one non-UV curable component, e.g. a polyol or glycol component, and a photoinitiator. After irradiation, these compositions provide a semi-solid or gellike material capable of dissolving upon exposure to water, to an alkaline or acidic solution or to a water detergent solution. 3D printing methodologies using such a soluble support material are also known as "Soluble Support Technology" or SST, and the support material formulation is often referred to a "soluble support material" or "soluble support material formulation". Soluble support materials should beneficially feature sufficient water solubility, so as to be removed during a relatively short time period, or sufficient solubility in a non-hazardous cleaning solution, yet, at the same, to exhibit mechanical properties sufficient to support the printed object during the additive manufacturing process.

Additional Background art includes U.S. patent application having Publication No. 2003/0207959; PCT International Patent Application having Publication No. WO2015/118552 and PCT International Patent Application No. IL2016/050886.

SUMMARY OF THE INVENTION

The present inventors have now designed and successfully practiced novel formulations which can be beneficially used in additive manufacturing processes, such as 3D inkjet printing. These formulations are designed such that the hardened (e.g., cured) material obtained therefrom (upon exposure to curing energy; e.g., light irradiation) is breakable upon immersion in an aqueous solution (e.g., in water).

The formulations described herein include a combination of a mono-functional curable component and a multi-functional curable (reactive) component, and optionally non-curable components, as described herein, selected so as to provide a cured material that breaks into small particles (physically decomposes) upon immersion in water and can thus be, for example, readily separated from other components in a fabricated object.

According to an aspect of some embodiments of the present invention there is provided a curable formulation comprising at least one mono-functional curable material and at least one multi-functional curable material, the mono-functional and multi-functional curable materials being selected such that a cured material formed upon exposing the formulation to a curing energy is water-breakable.

According to some of any of the embodiments described herein, the at least one mono-functional curable monomer is represented by Formula I:

Formula I wherein:
Ra is hydrogen, alkyl or cycloalkyl; and
Z is represented by X-L-Y,
wherein:
X is selected from $C(=O)$, $C(=O)-NR_1$, $C(=O)-O$, $P(=O)-(OR_2)-O$ or is absent;
Y is selected from $O^-M^+$, $OR_3$, $NR_4R_5$ or $N^+R_4R_5R_6Q^-$;
L is a hydrocarbon moiety of 1 to 40 atoms in length, optionally interrupted by one or more heteroatom(s), the heteroatoms being independently selected from O, S and $NR_2$, or is absent;
$Q^-$ is a negatively charged counter ion;
$M^+$ is a positively charged counter ion;
$R_1$ and $R_2$ are each independently selected from hydrogen, alkyl and cycloalkyl;
$R_3$ is selected from hydrogen, alkyl, cycloalkyl and aryl; and
$R_4$, $R_5$ and $R_6$ are each independently selected from hydrogen, alkyl and cycloalkyl, or, alternatively, $R_4$ and $R_5$ form a cyclic ring.

According to some of any of the embodiments described herein, Y is $N^+R_4R_5R_6Q$.

According to some of any of the embodiments described herein, L is a hydrocarbon moiety of 1 to 4 carbon atoms in length.

According to some of any of the embodiments described herein, X is selected from $C(=O)-NR_1$ and $C(=O)-O$.

According to some of any of the embodiments described herein, Y is $NR_4R_5$.

According to some of any of the embodiments described herein, L is absent.

According to some of any of the embodiments described herein, $R_4$ and $R_5$ form together a cyclic ring, the cyclic ring being a heteroalicyclic.

According to some of any of the embodiments described herein, X is $C(=O)$.

According to some of any of the embodiments described herein, Ra is hydrogen.

According to some of any of the embodiments described herein, Y is $OR_3$.

According to some of any of the embodiments described herein, L is a hydrocarbon moiety interrupted by one or more heteroatom(s).

According to some of any of the embodiments described herein, L comprises alkylene glycol moiety.

According to some of any of the embodiments described herein, X is $C(=O)$.

According to some of any of the embodiments described herein, L is a poly(alkylene glycol) moiety of from 2 to 20 alkylene glycol units.

According to some of any of the embodiments described herein, Ra is hydrogen.

According to some of any of the embodiments described herein, the mono-functional curable material is characterized as forming a polymeric (cured) material featuring a water uptake of at least 200%.

According to some of any of the embodiments described herein, the mono-functional curable material is characterized as forming a polymeric (cured) material featuring a hydrophilic lipophilic balance, determined according to Davies method, of at least 10.

According to some of any of the embodiments described herein, the mono-functional curable material is characterized as forming a polymeric (cured) material featuring a water solubility at least 50 weight percents.

According to some of any of the embodiments described herein, the at least one multi-functional curable material is:
(i) characterized as forming a polymer featuring a Tg higher than 20° C.; and/or
(iii) is represented by Formula II:

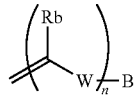

Formula II wherein:

Rb is hydrogen, alkyl or cycloalkyl;

n is an integer of from 2 to 10, representing a number of polymerizable groups =C(Rb)—W—;

W in each of the polymerizable groups is independently selected from C(=O)—O, C(=O)—NR$_8$, and C(=O) or is absent; and B is a hydrocarbon moiety of 1 to 20 atoms, interrupted and/or substituted by at least one hydrogen donor-containing group.

According to some of any of the embodiments described herein, the multi-functional curable material is characterized as forming a polymer featuring the Tg higher than 20° C., or higher than 30° C., or higher than 50° C., or higher than 80° C.

According to some of any of the embodiments described herein, the multi-functional curable material is represented by Formula H.

According to some of any of the embodiments described herein, the hydrogen donor-containing group is selected from oxygen, hydroxy, hydroxyalkyl, amine, aminoalkyl, thiol, thioalkyl.

According to some of any of the embodiments described herein, W in each of the polymerizable groups is independently selected from C(=O)—O, C(=O)—NR$_8$, and C(=O).

According to some of any of the embodiments described herein, the hydrogen donor-containing group is amine.

According to some of any of the embodiments described herein, B is a diaminoalkylene.

According to some of any of the embodiments described herein, B is 1,2-diaminoethylene.

According to some of any of the embodiments described herein, n is 2 and W in each of the polymerizable groups are each C(=O).

According to some of any of the embodiments described herein, the hydrogen donor-containing group is or comprises hydroxy.

According to some of any of the embodiments described herein, B is a hydrocarbon chain substituted by at least one hydroxy.

According to some of any of the embodiments described herein, B comprises at least one alkylene glycol moiety.

According to some of any of the embodiments described herein, the hydrogen donor-containing group is hydroxyalkyl.

According to some of any of the embodiments described herein, B is an alkylene of 1-4 carbon atoms, substituted by at least one hydroxyalkyl.

According to some of any of the embodiments described herein, B is a hydrocarbon chain interrupted by at least one oxygen atom.

According to some of any of the embodiments described herein, n is at least 3.

According to some of any of the embodiments described herein, W is each of the polymerizable groups is C(=O)—O.

According to some of any of the embodiments described herein, a concentration of the at least one mono-functional curable material ranges from 40 to 90, or from 40 to 80, weight percents of the total weight of the formulation.

According to some of any of the embodiments described herein, a concentration of the at least one multi-functional curable material is at least 5 weight percents of the total weight of the formulation.

According to some of any of the embodiments described herein, a concentration of the multi-functional curable material ranges from 5 to 60 weight percents of the total weight of the formulation.

According to some of any of the embodiments described herein, a type and concentration of each of the multi-functional curable material and the mono-functional curable monomer provides a cured material featuring a degree of cross-linking that ranges from about 10% to about 80%, or from about 20% to about 70%.

According to some of any of the embodiments described herein, the formulation further comprises at least one non-curable material.

According to some of any of the embodiments described herein, the at least one non-curable material comprises a water-miscible polymer.

According to some of any of the embodiments described herein, a concentration of the non-curable material ranges from 1 to 10 weight percents of the total weight of the formulation.

According to some of any of the embodiments described herein, the formulation further comprises an initiator.

According to some of any of the embodiments described herein, the formulation further comprises an additional agent, such as a surface active agent and/or an inhibitor.

According to some of any of the embodiments described herein, the formulation is curable upon exposure to UV radiation.

According to some of any of the embodiments described herein, the aqueous solution is water.

According to some of any of the embodiments described herein, the cured material breaks upon the immersion into particles having a size ranging from 1 micron to 100 mm.

According to some of any of the embodiments described herein, at least 50% of the particles have a size lower than 10 mm.

According to some of any of the embodiments described herein, at least 50% of the particles have a size lower than 5 mm.

According to some of any of the embodiments described herein, at least 50% of the particles have a size lower than 3 mm, or lower than 2.5 mm.

According to some of any of the embodiments described herein, the cured material features a degree of cross linking that ranges from 10 to 80, or from 20 to 70%.

According to some of any of the embodiments described herein, the cured material is characterized by swelling capacity of from 10 to 300, or from 10 to 200, or from 10 to 150, or from 20 to 150% by weight.

According to some of any of the embodiments described herein, a 3-gram cube made of the cured material breaks upon static immersion in water in less than 10 hours, or less than 8 hours, or less than 6 hours, or less than 4 hours, or less than 3 hours, or less than 2 hours, or less than 1 hour.

According to some of any of the embodiments described herein, the formulation is as a building material formulation for additive manufacturing process.

According to some of any of the embodiments described herein, the process is a 3D-inkjet printing.

According to some of any of the embodiments described herein, the formulation is usable as a support material formulation.

According to an aspect of some embodiments of the present invention there is provided a method of fabricating a three-dimensional model object, the method comprising dispensing a building material so as to sequentially form a plurality of layers in a configured pattern corresponding to the shape of the object, wherein the building material comprises the curable formulation according to any one of the respective embodiments and any combination thereof.

According to some of any of the embodiments described herein, the building material comprises a modeling material formulation and a support material formulation, the support material formulation comprising the curable formulation as described herein in any of the respective embodiments and any combination thereof.

According to some of any of the embodiments described herein, the method further comprises, subsequent to the dispensing, exposing the building material to curing energy, to thereby obtain a printed objected which comprises a cured support material formed of the curable formulation.

According to some of any of the embodiments described herein, the method further comprises removing the cured support material, to thereby obtain the three-dimensional model object.

According to some of any of the embodiments described herein, the removing comprises contacting the cured support material with water.

According to some of any of the embodiments described herein, the contacting comprises static immersion of the cured support material in the water.

According to an aspect of some embodiments of the present invention there is provided a three-dimensional object fabricated by the method as described herein in any of the respective embodiments and any combination thereof.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

Implementation of the method and/or system of embodiments of the invention can involve performing or completing selected tasks manually, automatically, or a combination thereof. Moreover, according to actual instrumentation and equipment of embodiments of the method and/or system of the invention, several selected tasks could be implemented by hardware, by software or by firmware or by a combination thereof using an operating system.

For example, hardware for performing selected tasks according to embodiments of the invention could be implemented as a chip or a circuit. As software, selected tasks according to embodiments of the invention could be implemented as a plurality of software instructions being executed by a computer using any suitable operating system. In an exemplary embodiment of the invention, one or more tasks according to exemplary embodiments of method and/or system as described herein are performed by a data processor, such as a computing platform for executing a plurality of instructions. Optionally, the data processor includes a volatile memory for storing instructions and/or data and/or a non-volatile storage, for example, a magnetic hard-disk and/or removable media, for storing instructions and/or data. Optionally, a network connection is provided as well. A display and/or a user input device such as a keyboard or mouse are optionally provided as well.

BRIEF DESCRIPTION OF THE SEVERAL VIEWS OF THE DRAWING(S)

The patent or application file contains at least one drawing executed in color. Copies of this patent or patent application publication with color drawing(s) will be provided by the Office upon request and payment of the necessary fee.

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings:

FIG. 1 presents a schematic illustration of the decomposition of a highly cross-linked cured material obtained from an exemplary curable formulation according to some embodiments of the present invention, upon interaction with water.

Figure 2A:
Figure 2B:
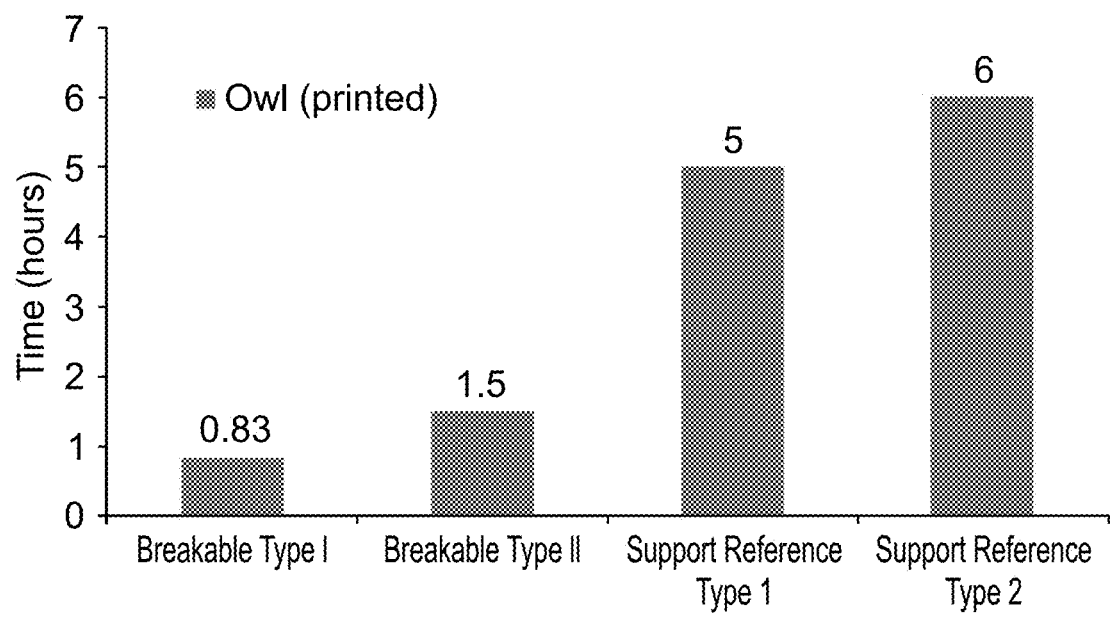

FIGS. 2A-B present an image of an owl-shaped object, fabricated by a 3D inkjet process using a curable formulation according to some embodiments of the present invention as a support material formulation, upon removal of the cured support material in water (FIG. 2A), and a bar graph showing the time by which a cured support material made from exemplary formulations according to embodiments of the present invention (breakable type 1 and breakable type 2) from the owl object upon static immersion in 3 L water compared to other soluble support materials (type 1 support reference and type 2 support reference).

Figure 3A:
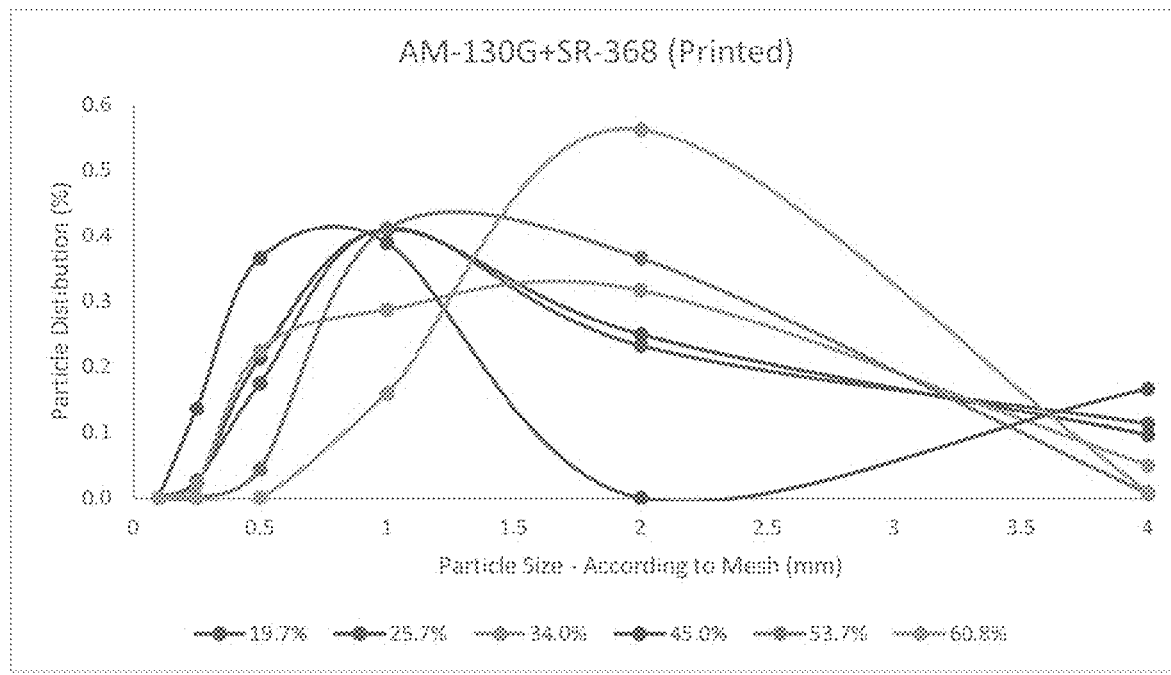
Figure 3B:
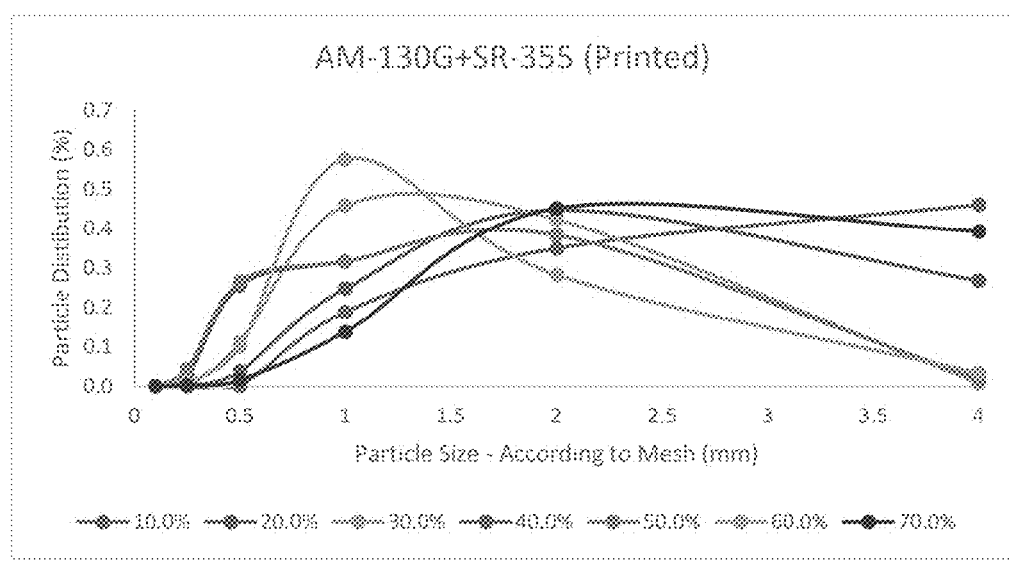
Figure 3C:
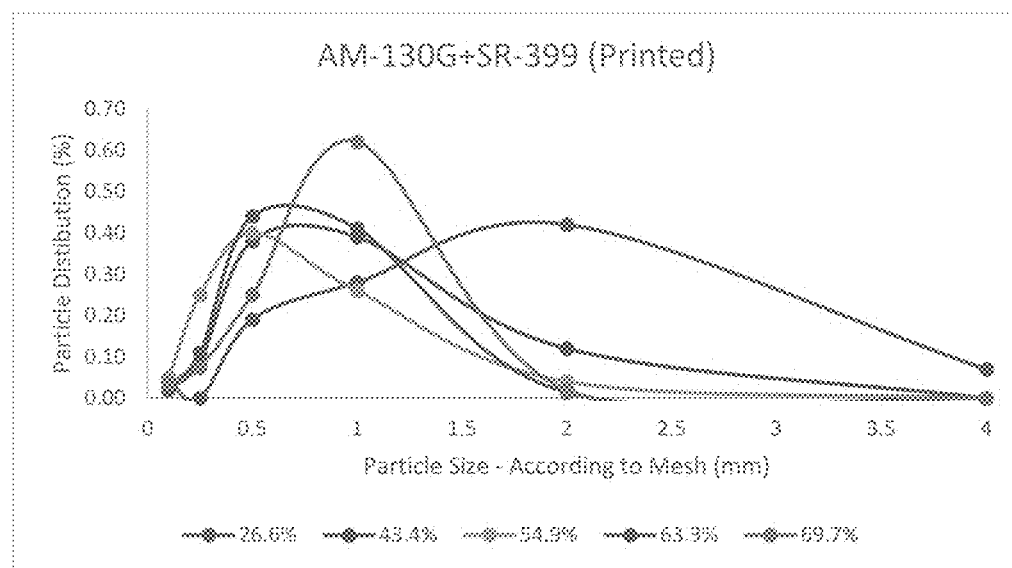

FIGS. 3A-C present a particles size distribution determined as described in Example 4, of particles obtained upon breakage of a printed cured sample obtained from a curable formulation comprising AG-130G as a mono-functional curable material, and, as a multi-functional curable material SR368 (FIG. 3A), SR355 (FIG. 3B) and SR399 (FIG. 3C), at various degrees of cross-linking.

Figure 4A:
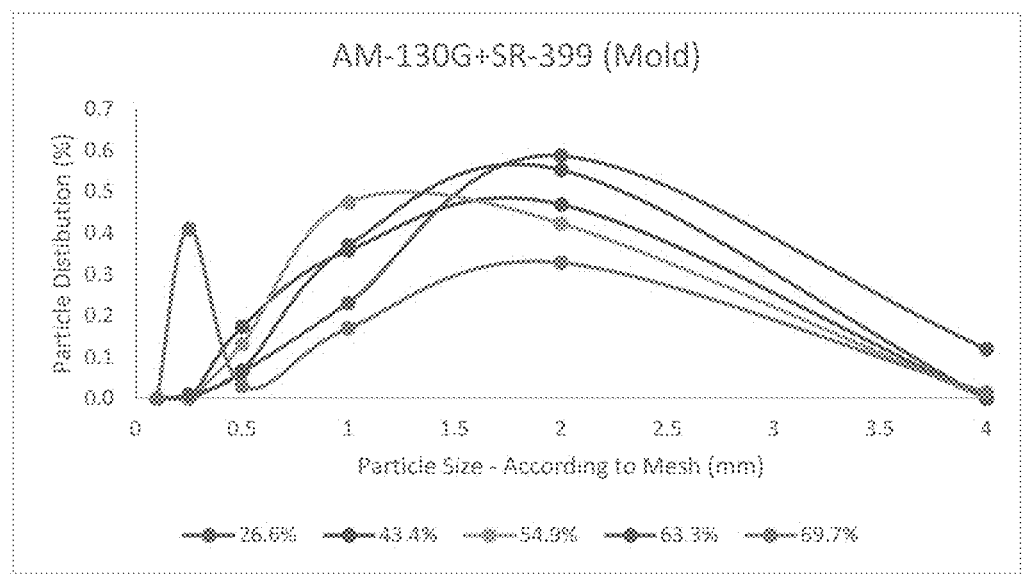
Figure 4B:
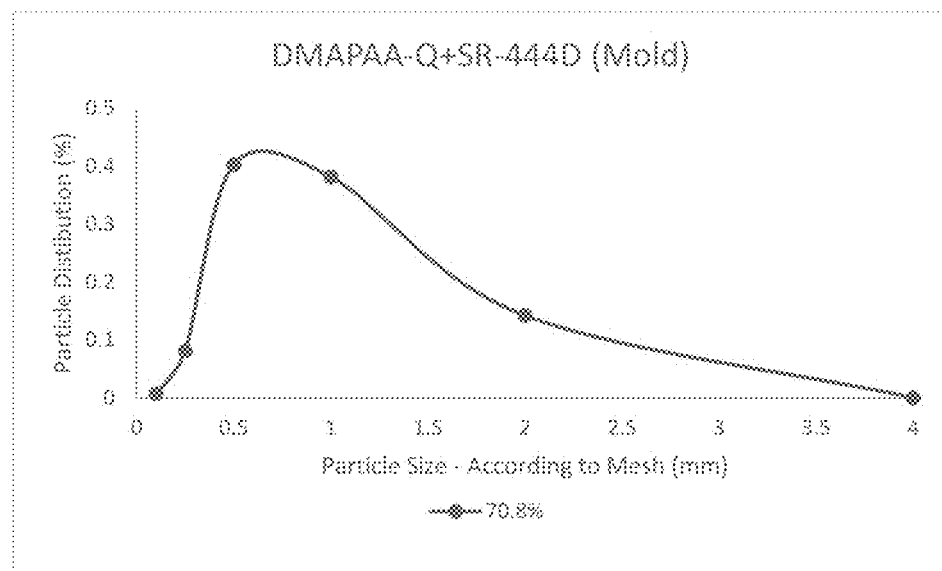

FIGS. 4A-B present a particles size distribution determined as described in Example 4, of particles obtained upon breakage of a molded cured sample obtained from a curable formulation comprising AG-130G as a mono-functional curable material and SR399 as a multi-functional curable material (FIG. 4A), and from a curable formulation comprising DMAPAA-Q as a mono-functional curable material and SR444D as a multi-functional curable material (FIG. 4B), at various degrees of cross-linking.

DESCRIPTION OF SPECIFIC EMBODIMENTS OF THE INVENTION

The present invention, in some embodiments thereof, relates to additive manufacturing (AM), and more particularly, but not exclusively, to water-breakable formulations useful in additive manufacturing such as three-dimensional inkjet printing, and to methods of additive manufacturing utilizing same.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

In a search for formulations suitable for use in additive manufacturing, for example, 3D inkjet printing, the present inventors have designed and successfully practiced novel formulations which are breakable upon immersion in water within exceptionally short time periods, ranging from minutes to several (e.g., 2-3) hours.

As discussed hereinabove, soluble formulations commonly used in additive manufacturing processes such as 3D inkjet printing are designed to feature high water solubility, and high swelling capacity (water absorbance). Such formulations typically comprise hydrophilic curable materials that upon curing form a cured material that often acts as a superabsorbent, namely, it is characterized by high swelling capacity due to the capability of the cured material to form hydrogen bonds with water molecules. Superabsorbents are typically characterized by a low cross-linking degree (low cross-linking density) and a swelling capacity as high as 400% or even 500%.

The present inventors have envisioned that a curable formulation which can form a cured material that is breakable upon contacting an aqueous solution can be beneficially used in additive manufacturing processes. In a search for such formulations, the present inventors have uncovered that such a water-breakable cured material can be formed while using a mixture of mono-functional and multi-functional curable materials which feature a combination of properties, such as one or more of rigidity, charge, water absorbance, and hydrophilicity/lipophilicity ratio and other properties, as discussed hereinunder, and which together provide a cured material that exhibits properties which render it water-breakable, such as, but not limited to, one or more of degree of crosslinking, rigidity, water absorbance and/or other properties, as discussed hereinunder. As demonstrated in the Examples section that follows, selected combinations that feature such properties were indeed shown to form, upon curing, a cured material that when immersed in water, absorbs the water up to a point where it breaks into pieces (physically decomposes).

By "breakable" or "breakability" it is meant herein a capability of a polymeric material to physically decompose (as opposed, for example, to chemical degradation or dissolution). In some embodiments, a breakable material decomposes, or breaks, into pieces, as described herein.

By "water breakable" it is meant herein a capability of a polymeric material to break, as defined herein, upon immersion in water and/or upon immersion in an aqueous solution other than water (for example, non-distilled water or other salt-containing aqueous solutions). In some embodiments, a water-breakable material breaks upon static immersion in water. The material breaks spontaneously, namely, without applying any physical or mechanical force other than contacting an aqueous solution such as water.

Reference is now made to FIG. 1, which schematically describes an exemplary cured material according to the rationale underlying the present invention. As shown therein a cured material features a polymeric network which comprises a plurality of polymeric chains (black curved lines), and chemical cross-linking (red curved lines) as well as other intermolecular interactions, such as, for example, hydrogen bonds (blue dashed lines), between the polymeric chains.

Without being bound by any particular theory, it is assumed that upon contacting water, water molecules enter between the polymeric chains, and interfere with the hydrogen bonds formed between the chains and optionally with other intermolecular interactions. However, and further without being bound by any particular theory, due to the water absorbance capability of at least some of the curable materials forming the polymerized material and a certain degree of covalent cross-linking, and/or the relatively rigid nature of the polymerized material according to embodiments of the present invention, the diffusion of water molecules into the polymeric network apply pressure to the polymeric network and as a result, the polymerized (cured) material spontaneously breaks into particles.

The curable formulations described herein are therefore designed capable of forming a water-breakable cured material. Such formulations are particularly usable as support material formulations in additive manufacturing processes such as 3D inkjet printing, which can be easily removed upon immersion in water, without subjecting a fabricated object to mechanical and/or chemical means which can adversely affect the object and/or are laborious or environmentally unfriendly. Such formulations, however, are also usable as modeling material formulations, for example, for fabricating water-breakable objects.

As shown in FIGS. 2A-B, the novel formulations described herein were successfully utilized for forming a cured support material in 3D inkjet printing methods, which is completely removed within exceptionally short time periods, upon simple immersion in water, and thus supersedes currently known and/or available formulations for forming soluble hardened support materials.

As shown in FIGS. 3A-C and 4A-B, exemplary novel formulations according to some embodiments of the present invention form a cured material which breaks, upon immersion in water, to thereby form a plurality of particles with an average particles size (e.g., a particles size of 50% of the particles) of up to about 4 mm.

Herein throughout, the term "object" or "printed object" or "fabricated object" describes a product of an additive manufacturing process. This term refers to the product obtained by a method as described herein, before removal of the cured support material. A printed object is therefore made of hardened (e.g., cured) modeling material and hardened (e.g., cured) support material, or, collectively, of a hardened building material.

The term "printed object" as used herein throughout refers to a whole printed object or a part thereof.

The term "model", as used herein, describes a final product of the manufacturing process. This term refers to the product obtained by a method as described herein, after removal of the support material. The model therefore essentially consists of a cured modeling material, unless otherwise indicated. This term is also referred to herein as "model object", "final object" or simply as "object".

The terms "model", "model object", "final object" and "object", as used herein throughout, refer to a whole object or a part thereof.

Herein throughout, the phrase "uncured building material" collectively describes the materials that are dispensed during the fabrication process so as to sequentially form the layers, as described herein. This phrase encompasses uncured materials dispensed so as to form the printed object, namely, one or more uncured modeling material formulation(s), and optionally uncured materials dispensed so as to form the support, namely uncured support material formulations.

Herein throughout, the phrase "modeling material formulation", which is also referred to herein interchangeably as "modeling formulation" or simply as "formulation", describes a part of the uncured building material which is dispensed so as to form the model object, as described herein. The modeling formulation is an uncured modeling formulation, which, upon exposure to curing energy, forms the final object or a part thereof.

An uncured building material can comprise one or more modeling formulations, and can be dispensed such that different parts of the model object are made upon curing different modeling formulations, and hence are made of different cured modeling materials or different mixtures of cured modeling materials.

Herein throughout, the phrase "support material formulation", which is also referred to herein interchangeably as "support formulation", describes a part of the uncured building material which is dispensed so as to form the support material, as described herein. The support material formulation is an uncured formulation, which, upon exposure to curing energy, forms the hardened support material.

Herein throughout, the phrases "cured modeling material" and "hardened modeling material", which are used interchangeably, describe the part of the building material that forms a model object, as defined herein, upon exposing the dispensed building material to curing, and following removal of the cured support material, if present. The cured modeling material can be a single cured material or a mixture of two or more cured materials, depending on the modeling material formulations used in the method, as described herein.

Herein throughout, the phrase "hardened support material" is also referred to herein interchangeably as "cured support material" or simply as "support material" and describes the part of the hardened (cured) building material that is intended to support the fabricated final object during the fabrication process, and which is removed once the process is completed and a hardened modeling material is obtained.

In some of any of the embodiments described herein, an uncured formulation (of a building material, a support material and a modeling material) is typically a curable formulation, which forms a hardened material upon curing.

Herein throughout, the term "curable formulation" describes a mixture of materials which, when exposed to curing energy, as described herein, solidifies or hardens to form a cured material as defined herein. Curable formulations comprise one or more curable materials, and may optionally further comprise one or more non-curable materials, initiators, and other additives.

The term "curable material" describes a compound or a mixture of compounds which are typically polymerizable materials that undergo polymerization and/or cross-linking, and thus cure or harden, when exposed to a suitable curing energy.

Curable materials can be monomeric and/or oligomeric and/or polymeric compounds.

A "curable material" is also referred to herein and in the art as "reactive" material.

The polymerization and/or cross-linking of curable materials can be effected via any known polymerization reaction, for example, free radical polymerization, cationic polymerization, and the like.

In some of any of the embodiments described herein, a curable material is a photopolymerizable material, which polymerizes or undergoes cross-linking upon exposure to radiation, as described herein, and in some embodiments the curable material is a UV-curable material, which polymerizes and/or undergoes cross-linking upon exposure to UV-vis radiation, as described herein.

In some embodiments, a curable material as described herein is a polymerizable material that polymerizes via photo-induced radical polymerization.

Alternatively, a curable material is a thermo-curable material which polymerizes and/or undergoes cross-linking when exposed to thermal curing (exposed to heat energy).

In some of any of the embodiments described herein, a curable material can comprise a monomer, and/or an oligomer and/or a short-chain polymer, each being polymerizable and/or cross-linkable as described herein.

In some of any of the embodiments described herein, when a curable material is exposed to curing energy (e.g., radiation), it polymerizes by any one, or combination, of chain elongation and cross-linking.

In some of any of the embodiments described herein, a curable material is a monomer or a mixture of monomers which can form a polymeric material upon a polymerization reaction, when exposed to curing energy at which the polymerization reaction occurs. Such curable materials are also referred to herein as "monomeric curable materials", or as "curable monomers".

In some of any of the embodiments described herein, a curable material is a polymer or an oligomer or a mixture of polymers and/or oligomers which can form a polymeric material upon a polymerization and/or cross-linking reaction, when exposed to curing energy at which the polymerization and/or cross-linking reaction occurs.

A curable material can comprise a mono-functional curable material and/or a multi-functional curable material.

Herein, a mono-functional curable material comprises one functional group that can undergo polymerization when exposed to curing energy (e.g., radiation). A multi-functional curable material comprises two or more groups that can undergo polymerization when exposed to curing energy (e.g., radiation), and which in addition can participate in chemical cross-linking of polymeric chains formed upon exposure to curing energy.

When curable materials are polymerizable and/or cross-linkable materials, the cured material formed upon exposure to curing energy is a polymerized material or a polymeric network (e.g., a plurality of polymeric chains, at least two being cross-linked to one another), as described herein.

Herein, the phrases "exposing to a curing energy", "exposing to curing", "exposing to curing conditions" and "exposing to an energy source that affects curing", and grammatically diversions thereof, are used interchangeably, and mean that dispensed layers of uncured building material are exposed to the curing energy and the exposure is typically performed by applying a curing energy to the dispensed layers.

A "curing energy" typically includes application of radiation or application of heat.

The radiation can be electromagnetic radiation (e.g., ultraviolet or visible light), or electron beam radiation, or ultrasound radiation or microwave radiation, depending on the materials to be cured. The application of radiation (or irradiation) is effected by a suitable radiation source. For example, an ultraviolet or visible or infrared or Xenon lamp can be employed, as described herein.

A curable material or system that undergoes curing upon exposure to radiation is referred to herein interchangeably as "photopolymerizable" or "photoactivatable" or "photocurable".

When the radiation is a UV radiation, the curable material is referred to herein as UV-curable.

When the curing energy comprises heat, the curing is also referred to herein and in the art as "thermal curing" and comprises application of thermal energy. Applying thermal energy can be effected, for example, by heating a receiving medium onto which the layers are dispensed or a chamber hosting the receiving medium, as described herein. In some embodiments, the heating is effected using a resistive heater.

In some embodiments, the heating is effected by irradiating the dispensed layers by heat-inducing radiation. Such irradiation can be effected, for example, by means of an IR lamp or Xenon lamp, operated to emit radiation onto the deposited layer.

A curable material or system that undergoes curing upon exposure to heat is referred to herein as "thermally-curable" or "thermally-activatable" or "thermally-polymerizable".

Herein throughout, the phrase "cleaning time" describes the time needed to remove a cured support material from a fabricated object.

According to some embodiments of the present invention, the "cleaning time" equals to the time required for an amount of a cured material as described herein to break into small pieces upon immersion in water. This time can be measured by recording the time from immersing a cured material is water to when the cured material no longer decomposes, for example, the time at which no more change in the size of material's particles is observed.

Herein throughout, whenever the phrase "weight percents" is indicated in the context of embodiments of a curable formulation, it is meant weight percents of the total weight of the formulation as described herein.

The phrase "weight percents" is also referred to herein as "% by weight" or "% wt." or "wt. %".

Herein throughout, some embodiments of the present invention are described in the context of the additive manufacturing being a 3D inkjet printing. However, other additive manufacturing processes, such as, but not limited to, SLA and DLP, are contemplated.

The Curable Formulations:

The present inventors have designed and successfully prepared and practiced curable formulations which provide a cured material that is characterized as a water breakable material, as defined herein.

A breakability of a cured (polymerized) material, according to some embodiments of the present invention, can be effected upon uptake (swelling, absorbance) of water (or any other aqueous solution) in an amount which is from about 1% to about 300% the material's weight, or from 5% to 300%, or from 10% to 300%, or from 10% to 150%, or from 20% to 150%, including any subranges and intermediate values therebetween.

In some embodiments, a cured material as described herein is capable of swelling (absorbing) water (or any other aqueous solution) in an amount which is no more than 500% of its weight before it breaks into pieces. In some embodiments, a cured material as described herein is capable of (absorbing) water (or any other aqueous solution) in an amount which is no more than 400%, or no more than 350%, or no more than 300%, or no more than 250%, or no more than 200%, or no more than 150%, or no more than 120%, or no more than 100%, or no more than 95%, or no more than 90%, or no more than 85%, or no more than 80%, or no more than 75%, or no more than 70%, or no more than 65%, or no more than 60%, or no more than 55%, or no more than 50%, or no more than 45%, or no more than 40%, or no more than 35%, or no more than 30%, or no more than 25%, or no more than 20%, or no more than 15%, or no more than 10%, or no more than 5%, of its weight, before is breaks into pieces (physically decomposes).

In some of these embodiments, a cured material as described herein is capable of swelling (absorbance) water (or an aqueous solution) at a weight which is at least 0.1%, or at least 0.5%, or at least 1%, or at least 5%, or at least 8%, or at least 10%, of its weight before is breaks into pieces.

In some embodiments, a cured material as described herein is capable of swelling (absorbing) water (or any other aqueous solution) in an amount which is from about 1% to about 300% the material's weight, or from 5% to 300%, or from 10% to 300%, or from 10% to 150%, including any subranges and intermediate values therebetween, of its weight, before it breaks into pieces (physically decomposes). According to some of any of the embodiments described herein, the water breakable material breaks (physically decomposes), upon immersion in water, into particles which can be, for example, from 50% to 0.001% in size, of the size of the cured material.

Herein throughout, the term "particles" describes small pieces of the water-breakable material, which can adopt any shape and any size, for example, as described herein. The term "particles" is also referred to herein interchangeably as "grains", "pieces" and any other art synonym.

According to some of any of the embodiments described herein, the water breakable material breaks (physically decomposes), upon immersion in water, into particles having an average size of up to 10 mm. According to some of any of the embodiments described herein, the water breakable material breaks (physically decomposes), upon immersion in water, into particles having an average size of up to 8 mm. According to some of any of the embodiments described herein, the water breakable material breaks (physically decomposes), upon immersion in water, into particles having an average size of up to 6 mm. According to some of any of the embodiments described herein, the water breakable material breaks (physically decomposes), upon immersion in water, into particles having an average size of up to 5 mm. According to some of any of the embodiments described herein, the water breakable material breaks (physically decomposes), upon immersion in water, into particles having an average size of up to 4 mm. According to some of any of the embodiments described herein, the water breakable material breaks (physically decomposes), upon immersion in water, into particles having an average size of up to 3 mm. According to some of any of the embodiments described herein, the water breakable material breaks (physically decomposes), upon immersion in water, into particles having an average size of up to 2 mm.

By "average size" of the particles, it is meant a size which 50% of the particles do not exceed and 50% of the particles do exceed, and is also referred to in the art as d50.

In some embodiments, the cured material breaks into a plurality of particles, at least 50%, or at least 70%, or at least 90% of the particles having a size in a range of from few microns (e.g., 1, 2, 3, 4 or 5 microns) to about 10 mm. In some embodiments, the cured material breaks into a plurality of particles, at least 50%, or at least 70%, or at least 90% of the particles having a size in a range of from 1, 2, 3, 4 or 5 microns to about 8 mm. In some embodiments, the cured material breaks into a plurality of particles, at least 50%, or at least 70%, or at least 90% of the particles having a size in a range of from 1, 2, 3, 4 or 5 microns to about 8 mm. In some embodiments, the cured material breaks into a plurality of particles, at least 50%, or at least 70%, or at least 90% of the particles having a size in a range of from 1, 2, 3, 4 or 5 microns to about 6 mm. In some embodiments, the cured material breaks into a plurality of particles, at least 50%, or at least 70%, or at least 90% of the particles having a size in a range of from 1, 2, 3, 4 or 5 microns to about 5 mm. In some embodiments, the cured material breaks into a plurality of particles, at least 50%, or at least 70%, or at least 90% of the particles having a size in a range of from 1, 2, 3, 4 or 5 microns to about 4 mm. In some embodiments, the cured material breaks into a plurality of particles, at least 50%, or at least 70%, or at least 90% of the particles having a size in a range of from 1, 2, 3, 4 or 5 microns to about 3 mm. In some embodiments, the cured material breaks into a plurality of particles, at least 50%, or at least 70%, or at least 90% of the particles having a size in a range of from 1, 2, 3, 4 or 5 microns to about 2 mm. In some embodiments, the cured material breaks into a plurality of particles, at least 50%, or at least 70%, or at least 90% of the particles having a size in a range of from 100 microns to about 8 mm, or from about 100 microns to about mm, or from about 100 microns to about 5 mm, or from about 100 microns to about 4 mm. Intermediate values and subranges within any of the foregoing ranges are contemplated herewith. In some embodiments, the cured material breaks into a plurality of particles, at least 50 of the particles having a size in a range of from 100 microns to about 4 mm, or to about 2 mm. In some embodiments, the cured material breaks into a plurality of particles, at least 70 of the particles having a size in a range of from 100 microns to about 4 mm, or to about 2 mm. Exemplary particles size distribution of cured materials formed of the curable formulations described herein are presented in FIGS. 3A-C and 4A-B.

According to some embodiments, the curable formulations described herein are capable of forming a cured material which is such that a 3-gram cube made of the cured material is breakable, as described herein, upon static immersion in water in less than 10 hours, or less than 8 hours, or less than 6 hours, or less than 4 hours, or less than 3 hours, or less than 2 hours, or less than 1 hour, and even less than 40 minutes, less than 30 minutes, less than 20 minutes or less than 10 minutes.

In some of any of the embodiments described herein, a cured material breaks upon immersion is water regardless of the ratio between the size and/or shape of the cured material and the amount of water it contacts. For example, a 3-gram cube made of the cured material is breakable within substantially the same time period when immersed in 50 ml, 100 ml, 200 ml, 500, ml, 1 Liter or 1.5 Liter of water. In some embodiments, the time of static immersion of the cured material in water until it breaks depends on the chemical composition of the cured materials and associated properties and not on the volume or chemical composition of the aqueous formulation in which it is immersed.

According to some embodiments of the present invention, the formulations described herein are characterized as forming a cured material which exhibits a relatively low swelling capacity.

Herein throughout, and in the art, the term "swelling capacity", describes a property of a material to absorb and retain water or any other aqueous solution, is also referred to herein as "absorbance capacity" with respect to water to any other aqueous solution, and refers to the maximal amount of water (or an aqueous solution) that can be absorbed by the material relative to its weight. This term is expressed in wt % relative to the material's weight. For example, when 100 grams of a material can absorb up to 500 grams water, the water uptake of the material is considered as 500%; and when 100 grams of a material can absorb up 20 grams water, the water uptake of the material is considered as 20%.

According to some embodiments of the present invention, the formulations described herein are characterized as forming a cured material which exhibits a swelling capacity, as defined herein, which is lower than 500%, lower than 400%, lower than 350%, lower than 300%, preferably lower than 280%, lower than 250%, lower than 220%, lower than 200%, lower than 180%, lower than 170%, lower than 160%, lower than 150%, lower than 140%, lower than 130%, lower than 120%, lower than 1610%, lower than 100%, and more preferably lower, for example, lower than 90%, lower than 80%, lower than 70%, lower than 60%, lower than 50%, lower than 40%, lower than 35%, lower than 30%, lower than 25%, lower than 20%, lower than 15%, or as low as 10%.

According to some embodiments of the present invention, the formulations described herein are characterized as forming a cured material which exhibits a swelling capacity, as defined herein, that ranges from about 10% to about 300% or from about 10% to about 200% or from about 10% to about 150%, including any intermediate values and subranges therebetween. It is assumed that higher swelling capacities do not provide a cured material that is water-breakable as described herein, or which does not break into a plurality of particles, as described herein; and that lower swelling capacities do not feature water breakability.

The formulations described herein are alternatively, or in addition, characterized as forming a cured material which exhibits a relatively high degree of covalent cross-linking, as defined herein.

Herein throughout, and in the art, the term "cross-linking" describes the intermolecular interactions between polymeric chains in a polymerized material (a polymeric network). Such intermolecular interactions include, for example, hydrogen bonds, electrostatic interactions, aromatic interactions, and/or covalent cross-linking.

By "covalent cross-linking" or "covalently cross-linked" it is meant that at least some of the polymeric chains in a polymerized (cured) material are linked to one another via covalent bonds.

The term "cross-linking degree", which is also referred to herein as "degree of cross-linking" or "DOC", as used herein, describes a calculated, theoretical value presenting the percentages of the bonds in a polymeric network (e.g., of a cured material as described herein) which are covalent bonds between polymeric chains out of the total bonds formed. This value is calculated based on the amount of a multi-functional curable material relative to the sum of the mono-functional curable material and the multifunctional curable material in a curable formulation and on the respective percentage of polymerizable moieties in a multi-functional curable material out of the total number of polymerizable moieties in the formulation, assuming 100% conversion.

In some embodiments, a degree of cross-linking is calculated per the following equation:

$$DOC=(n_{XL} \times XL_f)/([(n_{XL} \times XL_f)+(n_{mm})]$$

With $n_{XL}$=Number of moles of a multifunctional curable material; $XL_f$=Number of curable (polymerizable) groups of the multifunctional curable material; $n_{mm}$=Number of monofunctional curable material.

According to some of any of the embodiments described herein, the cured material is characterized by a cross-linking degree, as defined herein, which is at least 1%, or at least 2%, or at least 3%, or at least 4%, or at least 5%, or at least 10%, or at least 15%, or at least 20%, or at least 25%, or at least 30%, or at least 35%, or at least 40%, or at least 45%, or at least 50%, or at least 55%, or at least 60%, or at least 60%, or at least 65%, or at least 70%. According to some of any of the embodiments described herein, the cured material is characterized by a cross-linking degree, as defined herein, which ranges from about 1% to about 90%, or from about 1% to about 80%, or from about 1% to about 70%, or from about 1% to about 60%, or from about 1%, to about 50%, or from about 1% to about 40%, or from about 5% to about 80%, or from about 5% to about 65%, preferably from about 10% to about 80%, or from about 10% to about 70%, or from about 10% to about 60%, or from about 20% to about 80%, or from about 20% to about 70%, or from about 20% to about 50%, including any intermediate values and subranges therebetween.

By selecting a multi-functional curable material, a mono-functional curable material and concentrations of the multi-functional and mono-functional curable materials (e.g., a molar ratio therebetween), a degree of cross-linking of the cured material can be determined.

In some embodiments, and as demonstrated in the Examples section that follows, a degree of cross linking affects the particles size distribution of the particles obtained upon water-breakage of the cured material.

In some embodiments, the properties of the water breakable cured material, such as the particles size distribution of the particles obtained upon breakage, is manipulated by selecting a degree of cross linking of the cured material, that is, by selecting a multi-functional curable material, a mono-functional curable material and concentrations of the multi-functional and mono-functional curable materials (e.g., a molar ratio therebetween), according to the above equation.

The formulations described herein are alternatively, or in addition, characterized as forming a cured material which exhibits a relatively high rigidity (e.g., a relatively high Tg).

According to an aspect of some embodiments of the present invention, there is provided a curable formulation which comprises at least one mono-functional curable material and at least one multi-functional curable material, selected so as to provide, upon exposure to a suitable curing energy, a water-breakable cured material as described herein.

According to some of any of the embodiments described herein, the at least one mono-functional curable material and the at least one multi-functional curable material are selected so as to provide, upon exposure to a suitable curing energy, a cured material that features one or more of the properties described hereinabove.

The Mono-Functional Curable Material:

According to some of any of the embodiments described herein, the curable formulation comprises one or more mono-functional curable material(s), at least one of the mono-functional materials being represented by Formula I:

Formula I wherein:
Ra is hydrogen, alkyl or cycloalkyl; and
Z is represented by X-L-Y,
wherein:
X is selected from —C(=O)—, —C(=O)—NR$_1$—, —C(=O)—O—, —P(=O)—(OR$_2$)—O— or is absent;
Y is selected from O$^-$M$^+$, OR$_3$, NR$_4$R$_5$ or N$^+$R$_4$R$_5$R$_6$Q$^-$;
L is a hydrocarbon moiety of 1 to 40 atoms in length, optionally interrupted by one or more heteroatom(s), the heteroatoms being independently selected from O, S and NR$_2$, or is absent;
Q is a negatively charged counter ion;
M is a positively charged counter ion; and
R$_1$ and R$_2$ are each independently selected from hydrogen, alkyl and cycloalkyl;

R$_3$ is selected from hydrogen, alkyl, cycloalkyl and aryl; and

R$_4$, R$_5$ and R$_6$ are each independently selected from hydrogen, alkyl and cycloalkyl, or, alternatively, R$_4$ and R$_5$ form a cyclic ring.

According to some of any of the embodiments described herein for a mono-functional curable material represented by Formula i, the mono-functional curable material is ionic, namely, it comprises a cation and an anion.

In some of these embodiments, Y is a charged group, which can either be positively charged group or a negatively charged group, and the curable compound further comprises a respective counter anion, which is presented in Formula I as forming a part of Y.

In some of any of the embodiments described herein, when the mono-functional curable material is ionic, the formulation may comprise an aqueous solution of the ionic material.

In some of any of the embodiments described herein, the curable material is ionized when in an aqueous solution.

Exemplary such curable materials are those in which Y is O$^-$M$^+$, and M$^+$ is H$^+$.

According to these embodiments, Y is OH and the curable material has a pKa lower than 7, such that at a pH above this pKa (e.g., pH 7) the curable material is ionized.

Exemplary curable material in which Y is OH that is ionized into O$^-$M$^+$ (e.g., at pH 7) include polymerizable carboxylic acids such as, for example, acrylic acid and vinyl phosphonic acid.

In exemplary embodiments, a mono-functional curable material is acrylic acid, such that in Formula I, X is C(=O), L is absent, Y is O$^-$M$^+$, and M$^+$ is H$^+$. In some of these embodiments, Ra is H.

In exemplary embodiments, a mono-functional curable material is vinyl phosphonic acid, such that in Formula I, X is P(=O)(OR$_1$), L is absent, Y is O$^-$M$^+$, and M$^+$ is H$^+$. In some of these embodiments, Ra is H.

According to some of any of the embodiments described herein for a mono-functional curable material represented by Formula I, the mono-functional curable material is ionic, and Y is a negatively charged group such as O$^-$, and further comprises a M$^+$ positively charged counter ion (a cation). M$^+$ can be H$^+$ or can otherwise be a metal cation, preferably a univalent metal cation such as an alkali metal cation (e.g., Na$^+$ or K$^+$).

According to some of any of the embodiments described herein for a mono-functional curable material represented by Formula I, the mono-functional curable material is ionic, and Y is a positively charged group such as N$^+$R$_4$R$_5$R$_6$, and further comprises a Q$^-$ negatively charged counter ion (an anion).

The anion Q$^-$ can be any univalent anion such as, but not limited to, halide (e.g., chloride, bromide or iodide, preferably chloride), sulfonate (e.g., tosylate, mesylate), oxalate, maleate, and the like.

In some of these embodiments, L is a hydrocarbon moiety, and in some embodiments, the hydrocarbon moiety is of 1 to 8, or 1 to 6, or 1 to 4 carbon atoms in length. In some embodiments, L is a hydrocarbon atom of 2 or 3 carbon atoms in length.

In some of these embodiments, the hydrocarbon moiety is an alkylene, and in some embodiments, it is an unsubstituted alkylene. The alkylene and can be, for example, butylenes, propylene ethylene or methylene, and is preferably ethylene or propylene.

In some of any of the embodiments described herein for Y being N$^+$R$_4$R$_5$R$_6$Q$^-$, one or more of R$_4$-R$_6$ is other than hydrogen, such that Y comprises secondary ammonium, or, preferably, a tertiary ammonium or a quaternary ammonium.

In some of these embodiments, each of $R_4$-$R_6$ is other than hydrogen.

In some embodiments, two or more, or each of $R_4$-$R_6$ is alkyl, as defined herein.

In some of any of the embodiments described herein for the curable mono-functional material being ionic, X is C(=O)—O, such that the curable material is a mono-functional acrylate, or mono-acrylate. In some of these embodiments, Ra is hydrogen. In some of these embodiments, Ra is methyl and the curable material is a mono-functional methacrylate.

In some of any of the embodiments described herein for the curable mono-functional material being ionic, X is C(=O)—$NR_1$, such that the curable material is a mono-functional acrylamide. In some of these embodiments, Ra is hydrogen. In some of these embodiments, Ra is methyl and the curable material is a mono-functional methacrylamide. In some of these embodiments, $R_1$ is hydrogen.

Curable formulations which comprise a mono-functional curable material which is ionic are also referred to herein as "type 1" formulations.

According to some of any of the embodiments described herein for a mono-functional curable material represented by Formula I, the mono-functional curable material is non-ionic.

Curable formulations which comprise a mono-functional curable material which is ionic are also referred to herein as "type 2" formulations.

In some of any of the embodiments described herein for a non-ionic mono-functional curable material of Formula I, Y is an amine, for example $NR_4R_5$, as presented herein.

In some of these embodiments, the amine is a tertiary amine, such that $R_4$ and $R_5$ are each other than hydrogen.

In some of the embodiments when Y is amine, L is absent, and in some of these embodiments, X is C(=O), and the curable material is an acrylamide.

An exemplary heteroalicyclic moiety is morpholine. An exemplary such curable material is acryloyl morpholine (ACMO™).

In some of these embodiments, $R_4$ and $R_5$ are both alkyl. An exemplary such curable material is N,N-diethyl acrylamide (DEAA™).

In some embodiments, L is a hydrocarbon moiety, as described herein, and in some embodiments it is an alkylene, as defined herein, preferably of 1 to 4 carbon atoms in length.

In some of these embodiments, Y is amine and $R_4$ and $R_5$ are both alkyl. An exemplary such curable material is N,N-dimethylamino propylacrylamide (DMAPAA™).

In some of these embodiments, X is C(=O)—$NR_1$ and the mono-functional curable material is a mono-functional acrylamide, or mono-acrylamide. In some of these embodiments, Ra is hydrogen. In some of these embodiments, Ra is methyl and the mono-functional curable material is a mono-functional methacrylamide. In some of these embodiments, $R_1$ is hydrogen.

In some of these embodiments, X is C(=O)—O and the mono-functional curable material is a mono-functional acrylate, or mono-acrylate. In some of these embodiments, Ra is hydrogen. In some of these embodiments, Ra is methyl and the mono-functional curable material is a mono-functional methacrylate.

In some embodiments, when Y is amine, as described herein, Ra is hydrogen.

In some of any of the embodiments described herein for a non-ionic mono-functional curable material of Formula I, Y is an alkoxy, represented in Formula I as $OR_3$, wherein $R_3$ is other than hydrogen is preferably an alkyl, as defined herein, and in some embodiments, Y is hydroxy.

In some of any of the embodiments described herein for Y being hydroxy or an alkoxy, L is a hydrocarbon moiety, as defined herein.

In some of these embodiments, L is a hydrocarbon moiety interrupted by one or more heteroatom(s).

In some embodiments, L is or comprises one or more alkylene glycol moieties.

In some embodiments, L is or comprises an alkylene glycol chain or a poly(alkylene glycol) chain, for example a poly(ethylene glycol) chain, composed of from 2 to 20, or from 2 to 15, or from 5-15 alkylene glycol units, as defined herein.

In some of any of the embodiments described herein for a Y being alkoxy, X is C(=O)—O, such that the mono-functional curable material is a mono-functional acrylate, or monoacrylate. In some embodiments, Ra is hydrogen. Alternatively, Ra is methyl and the curable material is a mono-functional or mono-methacrylate.

Exemplary mono-functional acrylates or methacrylates in which Y is alkoxy are mono-functional methyl-PEG (or MPEG) acrylates.

In some of any of the embodiments described herein for a mono-functional curable material of Formula I, Ra is hydrogen. In some embodiments, Ra is methyl.

It is to be noted that any other compounds encompassed by Formula I as described herein are contemplated as mono-functional curable materials suitable for inclusion in the curable formulations.

It is to be further noted that it is assumed, without being bound by any particular theory, that a curable mono-functional material suitable for inclusion in the curable formulation of the present embodiments should be either ionic and/or feature alkylated functional groups such as tertiary amine, tertiary or quaternary ammonium and/or alkoxy.

Exemplary mono-functional material suitable for use in the context of some embodiments of the present invention are presented on Table 1 hereinbelow.

In some of any of the embodiments described herein, the mono-functional curable material formed, upon curing (when used as the only curable material) a cured (e.g., polymeric) material that features one or more of the following characteristics:

a water uptake of at least 200%;
a hydrophilic lipophilic balance, determined according to Davies method, of at least 10; and
a water solubility at least 50 weight percents.

In the context of these embodiments, the phrase "water uptake" which also means "water absorbance" means the amount of water the polymeric material can absorb when immersed in water, relative to its weight (before contacting water).

In the context of these embodiments, the phrase "water solubility" describes the weight % of a polymer that is added to 100 grams water before the solution becomes turbid (non-transparent).

Exemplary mono-functional curable materials suitable for use in the context of the present embodiments are presented in Table 1 in the Examples section that follows.

The Multi-Functional Curable Material:

According to some of any of the embodiments described herein, the curable formulation comprises one or more multi-functional curable material(s), at least one of the multi-functional materials being:
(i) characterized as forming a polymer featuring a Tg higher than 20° C.; and/or
(iii) represented by Formula II:

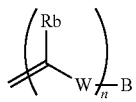

Formula II wherein:
Rb is hydrogen, alkyl or cycloalkyl;
n is an integer of from 2 to 10;
W in each of the polymerizable groups represented by =C(Rb)—W is independently selected from C(=O)—O, C(=O)—NR$_8$, and C(=O) or is absent; and
B is a hydrocarbon moiety of 1 to 20 atoms, or 2 to 20 atoms, interrupted and/or substituted by at least one hydrogen donor-containing group.

According to some of any of the embodiments described herein, the multi-functional curable material is characterized as forming a polymer (a cured material), when used per se, which features a Tg higher than 20° C., or higher than 30° C., or higher than 40° C., or higher than 50° C., or higher than 60° C., or higher than 70° C., or higher than 80° C., and even higher, for example from 90° C., 100° C., or higher.

According to some of any of the embodiments described herein, the multi-functional curable material is represented by Formula II.

According to some of any of the embodiments described herein, the multi-functional curable material is represented by Formula II and is characterized as forming a cured (polymerized) material that features a Tg of at least 20° C. or higher.

The multi-functional curable material can be a di-functional curable material, when n in formula II is 2, a tri-functional curable material, when n is 3, a tetra-functional or penta-functional or hexa-functional curable material, when n is 4, 5, or 6, respectively.

The multi-functional curable material comprises 2 or more polymerizable groups, represented by =C(Rb)—W in Formula II.

The moiety B connects the 2 or more polymerizable groups.

In some of any of the embodiments described herein, n is 2, and the moiety B is a bi-radical moiety that links the two polymerizable groups.

In some of any of the embodiments described herein, n is 3, and the moiety B is a tri-radical moiety that links between the three polymerizable groups. In some of these embodiments, B is or comprises a 3-arm (branching) moiety.

In some of any of the embodiments described herein, n is 4, and the moiety B links between the four polymerizable vinyl groups. In some of these embodiments, B is or comprises a 4-arm (branching) moiety, and so forth.

According to some of any of the embodiments described herein, the multi-functional curable material features one or more hydrogen donor-containing group(s), as defined herein, and in some of these embodiments, B comprises one or more hydrogen donor-containing group.

A hydrogen bond donor is a group that includes an electronegative atom to which a hydrogen atom is covalently bonded. The electronegative atom pulls electron density away from the hydrogen atom so that it develops a partial positive charge (S+). Thus, the hydrogen atom can interact with an atom having a partial negative charge (δ-), for example, an oxygen in a water molecule, through an electrostatic interaction.

A hydrogen donor-containing group, as used herein, describes a group that can participate in hydrogen interactions as a hydrogen bond donor.

Exemplary such groups include an electronegative atom (e.g., oxygen), hydroxy, hydroxyalkyl, amine (primary or secondary), aminoalkyl, thiol, and thioalkyl.

In some of any of the embodiments described herein, B comprises one or more hydroxy groups and/or one or more hydroxyalkyl groups and/or one or more amine groups.

In some of any of the embodiments described herein, W in each of the polymerizable groups is independently selected from C(=O)—O, C(=O)—NR$_8$, and C(=O).

In some of any of the embodiments described herein, in at least one of the polymerizable moieties, W is C(=O)—O.

In some of any of the embodiments described herein, in each of the polymerizable moieties, W is C(=O)—O. Such multi-functional curable materials are also referred to as multi-acrylates, and can be di-acrylates, tri-acrylates, and so forth.

In some of any of the embodiments described herein, the hydrogen donor-containing group is or comprises an amine. Preferably, the amine is a primary amine.

In some of these embodiments, B is or comprises an aminoalkyl, and in some embodiments, B is a diaminoalkylene.

In some of these embodiments, n is 2 and B is a 1,ω-aminoalkylene, in which the amino groups are attached to the terminal carbon atoms of the alkylene. Examples include 1,2-diaminoethylene, 1,3-siaminopropylene, 1,4-diaminobutylene, and so forth.

In exemplary embodiments, B is 1,2-diaminoethylene.

In some of the embodiments in which B is a 1,ω-aminoalkylene, W in each of the polymerizable groups is C(=O), and the curable material is a diacrylamide. When Rb is methyl, the curable material is a dimethacrylamide.

In some of any of the embodiments described herein for a multi-functional curable material represented by Formula II, the hydrogen donor-containing group is or comprises hydroxy.

In some embodiments, B is a hydrocarbon chain, as described herein, substituted by at least one hydroxy or a hydroxyalkyl.

In some of these embodiments, the hydrocarbon chain comprises one or more alkylene glycol groups, as described herein, and one or more of the alkylene glycol groups is substituted by a hydroxy or a hydroxyalkyl.

In exemplary embodiments, B comprises one or more propylene glycol groups, and at least one of the propylene glycol moieties is substituted by a hydroxy or a hydroxyalkyl.

In some of the embodiments in which B comprises one or more alkylene glycol groups, and one or more of the alkylene glycol groups is substituted by a hydroxy.

In some of any of the embodiments described herein for a multi-functional curable material represented by Formula II, the hydrogen donor-containing group is a hydroxyalkyl, for example a hydroxymethyl, a hydroxethyl, a hydroxypropyl, and so forth.

In some of any of the embodiments described herein for a multi-functional curable material represented by Formula II, B is an alkylene of 1-10 carbon atoms, or 1-18 carbon atoms, or 1-6 carbon atoms, or 1-4 carbon atoms, in length.

In some of any of the embodiments described herein for a multi-functional curable material represented by Formula II, B is an alkylene as described herein, substituted by at least one hydroxyalkyl.

In some of any of the embodiments described herein for a multi-functional curable material represented by Formula II, B is or comprises a branched alkylene, featuring 3 or more arms, at least one of which is or comprises a hydrogen bond donor-containing group as described herein.

In some of these embodiments, B is or comprises a branched alkylene featuring 3 or more arms, and one of these arms is or comprises a hydroxyalkyl.

In some of any of the embodiments described herein for a multi-functional curable material represented by Formula II, B is or comprises a branched hydrocarbon moiety, interrupted by one or more oxygen atoms (O atoms).

In some of any of the embodiments described herein for a multi-functional curable material represented by Formula II, B is or comprises a branched hydrocarbon moiety, optionally interrupted by a heteroatom (e.g., O), and optionally substituted by hydroxy or a hydroxyalkyl.

An exemplary branched hydrocarbon moiety is or comprises a $[-(CH_2)a]_3-C-(CH_2)m-O-(CH_2)k-C-[(CH_2)b-]_3$, in which a, b, m and k are each independently 0, 1, 2, 3, to 4 and up to 10, preferably 0-4, and more preferably from 1-4, and each terminal carbon is linked to a polymerizable group or to hydroxy or to hydrogen.

In some of any of the embodiments described herein for B being or comprising hydroxy, W is each of the polymerizable groups is $C(=O)-O$, as described herein.

In some of any of the embodiments described herein, Rb in each of the polymerizable groups can be the same or different. In some embodiments, Rb in each of the polymerizable groups is independently hydrogen or methyl. In some embodiments, Rb in each of the polymerizable groups is hydrogen. Alternatively, Rb in each of the polymerizable groups is methyl.

It is to be noted that any other compounds encompassed by Formula II as described herein are contemplated as multi-functional curable materials suitable for inclusion in the curable formulations.

Exemplary multi-functional curable materials suitable for use in the context of the present embodiments are presented in Table 2 in the Examples section that follows.

A Non-Curable Material:

In some of any of the embodiments described herein, a curable formulation as described herein in any one of the respective embodiments, and any combination thereof, in addition to the curable materials, one or more non-curable materials (also referred to herein as "non-reactive").

The term "non-curable" encompasses materials that are non-polymerizable under any conditions and/or are non-polymerizable under conditions at which curable materials as described herein are polymerizable, and/or are non-polymerizable under any condition used in a fabrication of an object. Such materials are typically devoid of a polymerizable group, for example, a UV-photopolymerizable group.

In some embodiments, the non-curable material is non-reactive towards the curable materials as described herein, that is, it does not react with the curable materials and is incapable of interfering with the curing thereof, under the fabrication conditions, including the curing conditions.

In some of any of the embodiments described herein, a non-curable material is a polymeric material.

In some of any of the embodiments described herein, the non-curable material is a water-miscible material, for example, a water-miscible polymeric material.

In some of any of the embodiments described herein the polymeric material is water soluble or water dispersible or water miscible polymeric material, as defined herein.

In some embodiments, the polymeric material comprises a plurality of hydrophilic groups as defined herein, either within the backbone chain of the polymer or as pendant groups. Exemplary such polymeric materials are polyols. Some representative examples include, but are not limited to, Polyol 3165, polypropylene glycol, polyethylene glycol, poly glycerol, ethoxylated forms of these polymers, paraffin oil and the like, and any combination thereof.

In some of any of the embodiments described herein, the non-curable material is a non-polymeric material, and in some embodiments, it is a water-miscible non-polymeric material such as, for example, 1,3-propane diol, 1,2-propane diol, trimethylolpropane, sorbitol, and Boltron P4290.

Any non-curable materials commonly used in additive manufacturing processes, preferably water-miscible non-curable materials, and any combination thereof, are contemplated.

Additional Agents:

A curable formulation as described herein in any of the respective embodiments can further comprise additional agents, for example, initiators, inhibitors, stabilizers and the like.

In some of any of the embodiments described herein, and any combination thereof, the curable formulation further comprises an initiator, for inducing a polymerization of the curable materials upon exposure to curing energy or curing conditions.

In some of these embodiments, one or more or all of the curable materials is a UV-curable material and the initiator is a photoinitiator.

The photoinitiator can be a free radical photo-initiator, a cationic photo-initiator, or any combination thereof.

A free radical photoinitiator may be any compound that produces a free radical upon exposure to radiation such as ultraviolet or visible radiation and thereby initiates a polymerization reaction. Non-limiting examples of suitable photoinitiators include phenyl ketones, such as alkyl/cycloalkyl phenyl ketones, benzophenones (aromatic ketones) such as benzophenone, methyl benzophenone, Michler's ketone and xanthones; acylphosphine oxide type photo-initiators such as 2,4,6-trimethylbenzolydiphenyl phosphine oxide (TMPO), 2,4,6-trimethylbenzoylethoxyphenyl phosphine oxide (TEPO), and bisacylphosphine oxides (BAPO's); benzoins and benzoin alkyl ethers such as benzoin, benzoin methyl ether and benzoin isopropyl ether and the like. Examples of photoinitiators are alpha-amino ketone, and 1-hydroxycyclohexyl phenyl ketone (e.g., marketed as Igracure® 184).

A free-radical photo-initiator may be used alone or in combination with a co-initiator. Co-initiators are used with initiators that need a second molecule to produce a radical that is active in the UV-systems. Benzophenone is an example of a photoinitiator that requires a second molecule, such as an amine, to produce a curable radical. After absorbing radiation, benzophenone reacts with a ternary amine by hydrogen abstraction, to generate an alpha-amino radical which initiates polymerization of acrylates. Non-limiting example of a class of co-initiators are alkanolamines such as triethylamine, methyldiethanolamine and triethanolamine.

Suitable cationic photoinitiators include, for example, compounds which form aprotic acids or Bronstead acids upon exposure to ultraviolet and/or visible light sufficient to initiate polymerization. The photoinitiator used may be a single compound, a mixture of two or more active compounds, or a combination of two or more different compounds, i.e. co-initiators. Non-limiting examples of suitable cationic photoinitiators include aryldiazonium salts, diaryliodonium salts, triarylsulphonium salts, triarylselenonium salts and the like. An exemplary cationic photoinitiator is a mixture of triarylsolfonium hexafluoroantimonate salts.

In some of any of the embodiments described herein, the curable formulation may further comprise one or more additional agents that are beneficially used in the fabrication process. Such agents include, for example, surface active agents, inhibitors and stabilizers.

In some embodiments, a curable formulation as described herein comprises a surface active agent. A surface-active agent may be used to reduce the surface tension of the formulation to the value required for jetting or for other printing process, which is typically around 30 dyne/cm. An exemplary such agent is a silicone surface additive such as, but not limited to, a surface agent marketed as BYK-345.

In some embodiments, a curable formulation as described herein further comprises an inhibitor, which inhibits pre-polymerization of the curable material during the fabrication process and before it is subjected to curing conditions. An exemplary stabilizer (inhibitor) is Tris(N-nitroso-N-phenylhydroxylamine) Aluminum Salt (NPAL) (e.g., as marketed under FirstCure® NPAL).

Suitable stabilizers include, for example, thermal stabilizers, which stabilize the formulation at high temperatures.

In some of any of the embodiments described herein, the curable formulation is devoid of a silicon polyether.

In some of any of the embodiments described herein, the curable formulation further comprises water.

In some of any of the embodiments described herein, a curable formulation comprises one or more curable materials, in addition to the mono-functional and multi-functional curable materials described herein.

In some of any of the embodiments described herein, such curable materials can be any curable materials commonly used in model fabrication processes, for example, 3D printing processes.

In some of these embodiments, one or more of the additional curable materials is a water-miscible curable material.

In some of any of these embodiments, the additional curable materials are curable upon exposure to the same curing conditions as the mono-functional and multi-functional curable materials described herein. For example, when the mono-functional and multi-functional curable materials described herein, are photopolymerizable materials (e.g., UV-curable), the one or more additional curable materials are also photopolymerizable (e.g., UV-curable).

The additional curable materials can be monomeric, oligomeric and/or polymeric materials.

Exemplary additional mono-functional UV-curable materials include, but are not limited to, acryloyl morpholine (ACMO), hydroxyethyl acrylamide, hydroxymethyl acrylamide, N-(3,3-dimethylaminopropyl) methacrylamide, methacrylamide (2-methyl-propenamide), NIPAM, vinyl ethers, isobornyl acrylate, isobornyl methacrylate, oligo(alkylene glycol) monoacrylates, and oligouerthane acrylates. Other water-miscible mono-functional acrylates, methacrylates, acrylamides or methacrylamides are contemplated.

Exemplary additional multi-functional (e.g., di-functional) UV-curable materials include, but are not limited to, poly(ethylene glycol) diacrylates, poly(ethylene glycol) dimethacrylate, poly(ethylene glycol)-poly(ethylene glycol) urethane diacrylates, and a partially acrylated polyol oligomers.

Exemplary Support Material Formulations:

In some of any of the embodiments described herein, a curable support material formulation as described herein comprises one or more of the mono-functional curable materials presented in Table 1 below.

In some of any of the embodiments described herein, a curable support material formulation as described herein comprises one or more of the multi-functional curable materials presented in Table 2 below.

In some of any of the embodiments described herein, a curable support material formulation as described herein comprises one or more of the mono-functional curable materials presented in Table 1 below and one or more of the multi-functional curable materials presented in Table 2 below.

In some of any of the embodiments described herein, a curable formulation comprises one or more mono-functional curable material represented by Formula I, as described herein; and/or one or more of the multi-functional curable materials as described herein.

In some of any of the embodiments described herein, a curable formulation comprises one or more mono-functional curable material represented by Formula I, as described herein; and/or one or more of the multi-functional curable materials represented by Formula II, as described herein.

According to some of any of the embodiments described herein, the curable formulation is such that a concentration of the mono-functional curable material(s) represented by Formula I as described herein ranges from 40% to 90%, or from 40% to 80%, or from 50% to 80%, by weight of the total weight of the formulation.

According to some of any of the embodiments described herein, the curable formulation is such that a total concentration of mono-functional curable materials (e.g., curable materials represented by Formula I as described herein and additional mono-functional curable materials as described herein) ranges from 40% to 90%, or from 40% to 80%, or from 50% to 80%, by weight of the total weight of the formulation, including any intermediate values and subranges therebetween.

According to some of any of the embodiments described herein, the curable formulation is such that a concentration of the multi-functional curable material as described herein is at least 5% by weight of the total weight of the formulation.

According to some of any of the embodiments described herein, the curable formulation is such that a concentration of the multi-functional curable material as described herein ranges from 5 to 80, or from 5 to 75, or from 5 to 70, or from 5 to 65, or from 5 to 60, or from 5 to 50, or from 5 to 40, or from 5 to 30, or from 5 to 30, or from 5-25, or from 5-20, or from 5 to 15, weight percents of the total weight of the formulation, including any intermediate values and subranges therebetween.

According to some of any of the embodiments described herein, the curable formulation is such that a total concentration of multi-functional curable materials (a multi-functional curable material as described herein ranges from 5 to 80, or from 5 to 75, or from 5 to 70, or from 5 to 65, or from 5 to 60, or from 5 to 50, or from 5 to 40, or from 5 to 30, or from 5 to 30, or from 5 to 25, or from 5 to 20, or from 5 to 15, weight percents of the total weight of the formulation, including any intermediate values and subranges therebetween.

The following lists non-limiting examples of combinations of mono-functional and multi-functional curable materials to be included in a curable formulation as described herein:

AM-130G and SR-610, at a DOC in a range of from 5 to 65;
AM-130G and SR-259, at a DOC in a range of from 5 to 90;
AM-130G and GDGDA, at a DOC in a range of from 5 to 65;
AM-130G and SR-508, at a DOC in a range of from 5 to 65;
AM-130G and SR-833S, at a DOC in a range of from 5 to 65;
AM-130G and SR-415, at a DOC in a range of from 5 to 25;
AM-130G and SR-444D, at a DOC in a range of from 5 to 65;
AM-130G and SR-368, at a DOC in a range of from 5 to 65;
AM-130G and SR-355, at a DOC in a range of from 5 to 65;
AM-130G and SR-399, at a DOC in a range of from 5 to 65;
HEAA and SR-610, at a DOC in a range of from 5 to 25;
HEAA and SR-259, at a DOC in a range of from 5 to 45;
HEAA and GDGDA, at a DOC in a range of from 5 to 45;
HEAA and SR-508, at a DOC in a range of from 5 to 25;
HEAA and SR-833S, at a DOC in a range of from 5 to 65;
HEAA and SR-415, at a DOC of 5;
HEAA and SR-444D, at a DOC in a range of from 5 to 45;
HEAA and SR-368, at a DOC in a range of from 5 to 25;
HEAA and SR-355, at a DOC in a range of from 5 to 25;
HEAA and SR-399, at a DOC in a range of from 5 to 25;
ACMO and SR-259, at a DOC of 5;
ACMO and SR-415, at a DOC of 5;
DMAPAA and SR-399, at a DOC of 25-45;
PEA-6 and SR-508, at a DOC of 5-65;
PEA-6 and SR-355, at a DOC of 5-65;
PEA-6 and SR-399, at a DOC of 5-65.

According to some of any of the embodiments described herein, the support curable formulation further comprises a non-curable material as described herein. In some embodiments, a concentration of the non-curable material ranges from 1 to 20, or from 1 to 10, weight percents of the total weight of the formulation.

According to some of any of the embodiments described herein, the curable formulation further comprises an initiator (e.g., a photoinitiator) at a concentration of from 0.1 to 4, or from 0.5 to 4, or from 0.5 to 3, or from 0.5 to 2, weight percents of the total weight of the composition.

According to some of any of the embodiments described herein, the curable formulation further comprises an inhibitor at a concentration of from 0 to 2 weight percents of the total weight of the composition; and/or a surfactant, at a concentration of 0 to 2 weight percents of the total weight of the composition.

Exemplary formulations are presented in Tables 3-5 below.

According to some of any of the embodiments described herein, the curable formulation exhibits a viscosity that is suitable for 3D inkjet printing.

In exemplary embodiments, the viscosity of the curable formulation is lower than 30 cps, or lower than 25 cps, or lower than 20 cps, at the working temperature. In some embodiments, the viscosity of the formulation is higher at room temperature and can be, for example, above 50 cps, or above 80 cps, at room temperature.

In some of any of the embodiments described herein, the curable formulation is such that exhibits a viscosity of from 10 to 20 cps at room temperature. In some embodiments, the curable materials, and the non-curable materials, and the concentration of each, are selected or manipulated such that the formulation exhibits a desired viscosity as described herein (before curing).

According to some of any of the embodiments described herein, the curable formulation as described herein is curable upon exposure to light energy.

According to some of any of the embodiments described herein, the curable formulation as described herein is UV-curable, as defined herein, and is curable upon exposure to UV radiation.

Model Fabrication:

The curable formulation as described herein is suitable for use as an uncured building material formulation in additive manufacturing process, as defined herein.

The curable formulation as described herein is suitable for use as an uncured building material formulation in 3D-inkjet printing processes.

The curable formulation as described herein can be used in such processes either as a modeling material formulation, for forming water-breakable model objects, or as a support material formulation, which forms a cured support material that can be easily removed, as described herein.

According to aspects of some of any of the embodiments described herein, there are provided methods of additive manufacturing, for fabricating a three-dimensional model object, which utilize a curable formulation as described herein.

According to an aspect of some embodiments of the present invention, there is provided a method of fabricating a three-dimensional model object, which comprises dispensing a uncured building material so as to sequentially form a plurality of layers in a configured pattern corresponding to the shape of the object, wherein the building material comprises a curable formulation as described herein.

In some of any of the embodiments described herein, the uncured building material comprises or consists of one or more modeling material formulations, and one or more of these modeling material formulations is a curable formulation according to any one of the present embodiments.

In some of any of the embodiments described herein, the uncured building material comprises one or more modeling material formulations, and one or more support material formulations, and one or more of the support material formulations is a curable formulation according to any one of the present embodiments, In some of any of the embodiments described herein, the method further comprises, subsequent to the dispensing, exposing the building material to curing energy, to thereby obtain a printed objected which comprises a cured modeling material and optionally a cured support material.

When an uncured building material comprises a curable formulation as described herein as a support material formulation, the printed object comprises a cured modeling material and a cured support material, at least some of which is a cured material formed of a curable formulation according to the present embodiments.

The method of fabricating a three-dimensional model object, which utilizes a curable formulation as described herein is also referred to herein as a fabrication process or as a model fabrication process.

In some of any of the embodiments described herein for a method, in which the curable formulation as described herein is not a modeling material formulation but rather a support material formulation, the modeling material formulation can be any modeling material formulation used in additive manufacturing such as 3D inkjet printing, and is preferably curable under the same conditions at which the support material formulation is curable. The support material formulation is as described herein in any of the respective embodiments and any combination thereof.

According to some embodiments of the present invention, the fabrication method is additive manufacturing of a three-dimensional model object.

According to some of any embodiments of this aspect, formation of each layer is effected by dispensing at least one uncured building material, and exposing the dispensed building material to curing energy or curing conditions, as described herein, to thereby form a cured building material, which is comprised of a cured modeling material and optionally a cured support material.

According to some of any of the embodiments described herein, the additive manufacturing is preferably by three-dimensional (3D) inkjet printing.

The method of the present embodiments manufactures three-dimensional objects in a layerwise manner by forming a plurality of layers in a configured pattern corresponding to the shape of the objects.

Each layer is formed by an additive manufacturing apparatus which scans a two-dimensional surface and patterns it. While scanning, the apparatus visits a plurality of target locations on the two-dimensional layer or surface, and decides, for each target location or a group of target locations, whether or not the target location or group of target locations is to be occupied by building material, and which type of building material (e.g., a modeling material formulation or a support material formulation) is to be delivered thereto. The decision is made according to a computer image of the surface.

When the AM is by three-dimensional printing, an uncured building material, as defined herein, is dispensed from a dispensing head having a set of nozzles to deposit building material in layers on a supporting structure. The AM apparatus thus dispenses building material in target locations which are to be occupied and leaves other target locations void. The apparatus typically includes a plurality of dispensing heads, each of which can be configured to dispense a different building material. Thus, different target locations can be occupied by different building materials (e.g., a modeling formulation and/or a support formulation, as defined herein).

In some of any of the embodiments of this aspect of the present invention, the method begins by receiving 3D printing data corresponding to the shape of the object. The data can be received, for example, from a host computer which transmits digital data pertaining to fabrication instructions based on computer object data, e.g., in a form of a Standard Tessellation Language (STL) or a StereoLithography Contour (SLC) format, Virtual Reality Modeling Language (VRML), Additive Manufacturing File (AMF) format, Drawing Exchange Format (DXF), Polygon File Format (PLY) or any other format suitable for Computer-Aided Design (CAD).

Next, droplets of the uncured building material as described herein are dispensed in layers, on a receiving medium, using at least two different multi-nozzle inkjet printing heads, according to the printing data. The receiving medium can be a tray of a three-dimensional inkjet system or a previously deposited layer.

In some embodiments of the present invention, the dispensing is effected under ambient environment.

Optionally, before being dispensed, the uncured building material, or a part thereof (e.g., one or more formulations of the building material), is heated, prior to being dispensed. These embodiments are particularly useful for uncured building material formulations having relatively high viscosity at the operation temperature of the working chamber of a 3D inkjet printing system. The heating of the formulation(s) is preferably to a temperature that allows jetting the respective formulation through a nozzle of a printing head of a 3D inkjet printing system. In some embodiments of the present invention, the heating is to a temperature at which the respective formulation exhibits a viscosity of no more than X centipoises, where X is about 30 centipoises, preferably about 25 centipoises and more preferably about 20 centipoises, or 18 centipoises, or 16 centipoises, or 14 centipoises, or 12 centipoises, or 10 centipoises.

The heating can be executed before loading the respective formulation into the printing head of the 3D printing system, or while the formulation is in the printing head or while the formulation passes through the nozzle of the printing head.

In some embodiments, the heating is executed before loading of the respective formulation into the printing head, so as to avoid clogging of the printing head by the formulation in case its viscosity is too high.

In some embodiments, the heating is executed by heating the printing heads, at least while passing the formulation(s) through the nozzle of the printing head.

Once the uncured building material is dispensed on the receiving medium according to the 3D printing data, the method optionally and preferably continues by exposing the dispensed building material to conditions that effect curing. In some embodiments, the dispensed building material is exposed to curing energy by applying curing energy to the deposited layers. Preferably, the curing is applied to each individual layer following the deposition of the layer and prior to the deposition of the previous layer.

The curing energy or condition can be, for example, a radiation, such as an ultraviolet or visible irradiation, or other electromagnetic radiation, or electron beam radiation, depending on the building material used. The curing energy or condition applied to the dispensed layers serves for curing or solidifying or hardening the modeling material formulation and/or the support material formulation. Preferably, the same curing energy or condition is applied to effect curing of both the modeling materials and the support material, if present. Alternatively, different curing energies or conditions are applied to the dispensed building material, simultaneously or sequentially, to effect curing of the modeling material formulation and/or the support material formulation.

In some of any of the embodiments described herein, the method further comprises removing the cured support material, to thereby obtain the three-dimensional model object.

When an uncured building material comprises a curable formulation as described herein as a support material formulation, removing the cured support material formed of the curable formulation as described herein comprises contacting the cured support material with water, or an aqueous solution In some embodiments, removing the cured support material comprises contacting the entire printed object with water or an aqueous solution.

In some embodiments, removing the cured support material is effected by immersing the cured support material, or the entire printed object, in water or an aqueous solution.

In some embodiments, the immersion is static immersion, namely, the water or solution is not stirred.

Any volume of water or an aqueous solution can be used for removing a cured support material as described herein. Since a cured support material as described herein physically decomposes upon immersion in water, the concentration of the cured material in the water or solution does not affect its decomposition time or rate.

In some of the embodiments where an aqueous solution is used, the aqueous solution is substantially neutral, namely, has a pH of 6-8, or of 7.

In some of the embodiments where an aqueous solution is used, the aqueous solution is neither an alkaline solution nor an acidic solution (such as solutions commonly used to dissolve cured support materials in additive manufacturing).

The contacting with water or an aqueous solution can be effected manually or in an automated manner. Any system or apparatus usable for removing a cured support material is contemplated.

In some of any of the embodiments described herein, the contacting is effected for a time period that is suitable for a cured support material at hand, and can range from few (e.g., 1-3) minutes, to several (e.g., 2-8) hours, as further described hereinabove.

In some embodiments, the contacting is effected without replacing the water or aqueous solution (e.g., without introducing a fresh batch of water or aqueous solution to the apparatus or system where removal of the cured support material is performed).

Any system suitable for AM of an object (e.g., a model object) is usable for executing the method as described herein.

A representative and non-limiting example of a system suitable for AM of an object according to some embodiments of the present invention comprises an additive manufacturing apparatus having a dispensing unit which comprises a plurality of dispensing heads. Each head preferably comprises an array of one or more nozzles, through which a liquid (uncured) building material is dispensed.

Preferably, but not obligatorily, the AM apparatus is a three-dimensional inkjet printing apparatus, in which case the dispensing heads are inkjet printing heads, and the building material is dispensed via inkjet technology. This need not necessarily be the case, since, for some applications, it may not be necessary for the additive manufacturing apparatus to employ three-dimensional printing techniques. Representative examples of additive manufacturing apparatus contemplated according to various exemplary embodiments of the present invention include, without limitation, binder jet powder based apparatus, fused deposition modeling apparatus and fused material deposition apparatus.

Each dispensing head is optionally and preferably fed via one or more building material reservoir(s) which may optionally include a temperature control unit (e.g., a temperature sensor and/or a heating device), and a material level sensor. To dispense the building material, a voltage signal is applied to the dispensing heads to selectively deposit droplets of material via the dispensing head nozzles, for example, as in piezoelectric inkjet printing technology. The dispensing rate of each head depends on the number of nozzles, the type of nozzles and the applied voltage signal rate (frequency). Such dispensing heads are known to those skilled in the art of solid freeform fabrication.

Optionally, but not obligatorily, the overall number of dispensing nozzles or nozzle arrays is selected such that half of the dispensing nozzles are designated to dispense support material formulations (if included in an uncured building material) and half of the dispensing nozzles are designated to dispense modeling material formulations, i.e. the number of nozzles jetting modeling materials is the same as the number of nozzles jetting support material. Yet it is to be understood that it is not intended to limit the scope of the present invention and that the number of modeling material depositing heads (modeling heads) and the number of support material depositing heads (support heads) may differ. Generally, the number of modeling heads, the number of support heads and the number of nozzles in each respective head or head array are selected such as to provide a predetermined ratio, a, between the maximal dispensing rate of the support material and the maximal dispensing rate of modeling material. The value of the predetermined ratio, a, is preferably selected to ensure that in each formed layer, the height of modeling material equals the height of support material. Typical values for a are from about 0.6 to about 1.5.

For example, for a=1, the overall dispensing rate of support material formulation is generally the same as the overall dispensing rate of the modeling material formulation(s) when all modeling heads and support heads operate.

In a preferred embodiment, there are M modeling heads each having m arrays of p nozzles, and S support heads each having s arrays of q nozzles such that M×m×p=S×s×q. Each of the M×m modeling arrays and S×s support arrays can be manufactured as a separate physical unit, which can be assembled and disassembled from the group of arrays. In this embodiment, each such array optionally and preferably comprises a temperature control unit and a material level sensor of its own, and receives an individually controlled voltage for its operation.

The AM apparatus can further comprise a curing unit which can comprise one or more sources of a curing energy or a curing condition. The curing source can be, for example, a radiation source, such as an ultraviolet or visible or infrared lamp, or other sources of electromagnetic radiation, or electron beam source, depending on the modeling material formulation(s) being used. The curing energy source serves for curing or solidifying the building material formulation(s).

The dispensing head and curing energy source (e.g., radiation source) are preferably mounted in a frame or block which is preferably operative to reciprocally move over a tray, which serves as the working surface (a receiving medium). In some embodiments of the present invention, the curing energy (e.g., radiation) sources are mounted in the block such that they follow in the wake of the dispensing heads to at least partially cure or solidify the materials just dispensed by the dispensing heads. According to the common conventions, the tray is positioned in the X-Y plane, and is preferably configured to move vertically (along the Z direction), typically downward.

In various exemplary embodiments of the invention, the AM apparatus further comprises one or more leveling devices, e.g. a roller, which serve to straighten, level and/or establish a thickness of the newly formed layer prior to the formation of the successive layer thereon. The leveling device preferably comprises a waste collection device for collecting the excess material generated during leveling. The waste collection device may comprise any mechanism that delivers the material to a waste tank or waste cartridge.

In use, the dispensing heads as described herein move in a scanning direction, which is referred to herein as the X direction, and selectively dispense building material in a predetermined configuration in the course of their passage over the tray. The building material typically comprises one or more types of support material formulations and one or more types of modeling material formulations. The passage of the dispensing heads is followed by the curing of the modeling and support material formulation(s) by the source of curing energy or condition (e.g., radiation). In the reverse passage of the heads, back to their starting point for the layer just deposited, an additional dispensing of building material may be carried out, according to predetermined configuration. In the forward and/or reverse passages of the dispensing heads, the layer thus formed may be straightened by the leveling device, which preferably follows the path of the dispensing heads in their forward and/or reverse movement. Once the dispensing heads return to their starting point along the X direction, they may move to another position along an indexing direction, referred to herein as the Y direction, and continue to build the same layer by reciprocal movement along the X direction. Alternatively, the dispensing heads may move in the Y direction between forward and reverse movements or after more than one forward-reverse movement. The series of scans performed by the dispensing heads to complete a single layer is referred to herein as a single scan cycle.

Once the layer is completed, the tray is lowered in the Z direction to a predetermined Z level, according to the desired thickness of the layer subsequently to be printed. The procedure is repeated to form a three-dimensional object which comprises a modeling material and a support material in a layerwise manner.

In some embodiments, the tray may be displaced in the Z direction between forward and reverse passages of the dispensing head, within the layer. Such Z displacement is carried out in order to cause contact of the leveling device with the surface in one direction and prevent contact in the other direction.

The system for performing the method as described herein optionally and preferably comprises a building material supply apparatus which comprises the building material containers or cartridges and supplies a plurality of building material formulations (modeling material formulation(s) and/or a support material formulation as described herein) to the fabrication apparatus.

The system may further comprise a control unit which controls the fabrication apparatus and optionally and preferably also the supply apparatus as described herein. The control unit preferably communicates with a data processor which transmits digital data pertaining to fabrication instructions based on computer object data, stored on a computer readable medium, preferably a non-transitory medium, in a form of a Standard Tessellation Language (STL) format or any other format such as, but not limited to, the aforementioned formats. Typically, the control unit controls the voltage applied to each dispensing head or nozzle array and the temperature of the building material in the respective printing head.

Once the manufacturing data is loaded to the control unit, it can operate without user intervention. In some embodiments, the control unit receives additional input from the operator, e.g., using a data processor or using a user interface communicating with the control unit. The user interface can be of any type known in the art, such as, but not limited to, a keyboard, a touch screen and the like. For example, the control unit can receive, as additional input, one or more building material types and/or attributes, such as, but not limited to, color, characteristic distortion and/or transition temperature, viscosity, electrical property, magnetic property. Other attributes and groups of attributes are also contemplated.

Some embodiments contemplate the fabrication of an object by dispensing different materials from different dispensing heads. These embodiments provide, inter alia, the ability to select materials from a given number of materials and define desired combinations of the selected materials and their properties. According to the present embodiments, the spatial locations of the deposition of each material with the layer is defined, either to effect occupation of different three-dimensional spatial locations by different materials, or to effect occupation of substantially the same three-dimensional location or adjacent three-dimensional locations by two or more different materials so as to allow post deposition spatial combination of the materials within the layer, thereby to form a composite material at the respective location or locations.

Any post deposition combination or mix of modeling materials is contemplated. For example, once a certain material is dispensed it may preserve its original properties. However, when it is dispensed simultaneously with another modeling material or other dispensed materials which are dispensed at the same or nearby locations, a composite material having a different property or properties to the dispensed materials is formed.

The present embodiments thus enable the deposition of a broad range of material combinations, and the fabrication of an object which may consist of multiple different combinations of materials, in different parts of the object, according to the properties desired to characterize each part of the object.

Further details on the principles and operations of an AM system such as described herein is found in U.S. patent application having Publication No. 2013/0073068, the contents of which are hereby incorporated by reference.

According to some embodiments of each of the methods and systems described herein, the uncured building material comprises at least one curable formulation as described herein.

The Model Object:

According to an aspect of some embodiments of the present invention, there is provided a three-dimensional model object prepared by the method as described herein, in any of the embodiments thereof and any combination thereof.

According to an aspect of some embodiments of the present invention there is provided a 3D model object, fabricated by an AM method as described herein.

According to an aspect of some embodiments of the present invention, there is provided a three-dimensional model object which is water breakable, or which comprises at least one water breakable portion, as defined herein.

In some embodiments, such a model object is fabricated by a method as described herein, in any one of the respective embodiments, wherein at least one modeling material formulation used to form the model object is a curable formulation as described herein.

As used herein the term "about" refers to ±10%.

The terms "comprises", "comprising", "includes", "including", "having" and their conjugates mean "including but not limited to".

The term "consisting of" means "including and limited to".

The term "consisting essentially of" means that the composition, method or structure may include additional ingredients, steps and/or parts, but only if the additional ingredients, steps and/or parts do not materially alter the basic and novel characteristics of the claimed composition, method or structure.

As used herein, the singular form "a", "an" and "the" include plural references unless the context clearly dictates otherwise. For example, the term "a compound" or "at least one compound" may include a plurality of compounds, including mixtures thereof. Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

As used herein the term "method" or "process" refers to manners, means, techniques and procedures for accomplishing a given task including, but not limited to, those manners, means, techniques and procedures either known to, or readily developed from known manners, means, techniques and procedures by practitioners of, e.g., the chemical, mechanical, and computational arts.

Herein throughout, the term "water-miscible" describes a material which is at least partially dissolvable or dispersible in water, that is, at least 50% of the molecules move into the water upon mixture. This term encompasses the terms "water-soluble" and "water dispersible".

Herein throughout, the term "water-soluble" describes a material that when mixed with water in equal volumes or weights, a homogeneous solution is formed.

Herein throughout, the term "water-dispersible" describes a material that forms a homogeneous dispersion when mixed with water in equal volumes or weights.

Herein throughout, the phrase "linking moiety" or "linking group" describes a group that connects two or more moieties or groups in a compound. A linking moiety is typically derived from a bi- or tri-functional compound, and can be regarded as a bi- or tri-radical moiety, which is connected to two or three other moieties, via two or three atoms thereof, respectively.

A linking moiety which is tri-functional or of higher functionality can be branched moiety or a branching moiety, featuring 3 or more arms extending from the branching point.

Exemplary linking moieties include a linear or branched hydrocarbon moiety or chain, optionally interrupted by one or more heteroatoms, as defined herein, and/or any of the chemical groups listed below, when defined as linking groups.

When a chemical group is referred to herein as "end group" it is to be interpreted as a substituent, which is connected to another group via one atom thereof.

As used herein, the term "amine" describes both a —NRxRy group and a —NRx- group, wherein Rx and Ry are each independently hydrogen, alkyl, cycloalkyl, aryl, as these terms are defined hereinbelow.

The amine group can therefore be a primary amine, where both Rx and Ry are hydrogen, a secondary amine, where Rx is hydrogen and Ry is alkyl, cycloalkyl or aryl, or a tertiary amine, where each of Rx and Ry is independently alkyl, cycloalkyl or aryl.

Alternatively, Rx and Ry can each independently be hydroxyalkyl, trihaloalkyl, cycloalkyl, alkenyl, alkynyl, aryl, heteroaryl, heteroalicyclic, amine, halide, sulfonate, sulfoxide, phosphonate, hydroxy, alkoxy, aryloxy, thiohydroxy, thioalkoxy, thioaryloxy, cyano, nitro, azo, sulfonamide, carbonyl, C-carboxylate, O-carboxylate, N-thiocarbamate, O-thiocarbamate, urea, thiourea, N-carbamate, O-carbamate, C-amide, N-amide, guanyl, guanidine and hydrazine.

The term "amine" is used herein to describe a —NRxRy group in cases where the amine is an end group, as defined hereinunder, and is used herein to describe a —NRx- group in cases where the amine is a linking group or is or part of a linking moiety.

An amine end group can be a primary amine, in case both Rx and Ry are hydrogen, or secondary, when one of Rx and Ry is other than hydrogen (e.g., alkyl, cycloalkyl, aryl, alkenyl, and the like), or tertiary, in case each of Rx and Ry is other than hydrogen.

An amine linking group is a secondary amine when Rx is hydrogen, and is a tertiary amine when Rx is other than hydrogen.

The term "alkyl" describes a saturated aliphatic hydrocarbon including straight chain and branched chain groups. Preferably, the alkyl group has 1 to 20 carbon atoms. Whenever a numerical range; e.g., "1-20", is stated herein, it implies that the group, in this case the alkyl group, may contain 1 carbon atom, 2 carbon atoms, 3 carbon atoms, etc., up to and including 20 carbon atoms. More preferably, the alkyl is a medium size alkyl having 1 to 10 carbon atoms. Most preferably, unless otherwise indicated, the alkyl is a lower alkyl having 1 to 4 carbon atoms (C(1-4) alkyl). The alkyl group may be substituted or unsubstituted. Substituted alkyl may have one or more substituents, whereby each substituent group can independently be, for example, hydroxyalkyl, trihaloalkyl, cycloalkyl, alkenyl, alkynyl, aryl, heteroaryl, heteroalicyclic, amine, halide, sulfonate, sulfoxide, phosphonate, hydroxy, alkoxy, aryloxy, thiohydroxy, thioalkoxy, thioaryloxy, cyano, nitro, azo, sulfonamide, C-carboxylate, O-carboxylate, N-thiocarbamate, O-thiocarbamate, urea, thiourea, N-carbamate, O-carbamate, C-amide, N-amide, guanyl, guanidine and hydrazine.

The alkyl group can be an end group, as this phrase is defined hereinabove, wherein it is attached to a single adjacent atom, or a linking group, as this phrase is defined hereinabove, which connects two or more moieties via at least two carbons in its chain. When the alkyl is a linking group, it is also referred to herein as "alkylene" or "alkylene chain".

Alkene and alkyne, as used herein, are an alkyl, as defined herein, which contains one or more double bond or triple bond, respectively.

The term "cycloalkyl" describes an all-carbon monocyclic ring or fused rings (i.e., rings which share an adjacent pair of carbon atoms) group where one or more of the rings does not have a completely conjugated pi-electron system. Examples include, without limitation, cyclohexane, adamantine, norbornyl, isobornyl, and the like. The cycloalkyl group may be substituted or unsubstituted. Substituted cycloalkyl may have one or more substituents, whereby each substituent group can independently be, for example, hydroxyalkyl, trihaloalkyl, cycloalkyl, alkenyl, alkynyl, aryl, heteroaryl, heteroalicyclic, amine, halide, sulfonate, sulfoxide, phosphonate, hydroxy, alkoxy, aryloxy, thiohydroxy, thioalkoxy, thioaryloxy, cyano, nitro, azo, sulfonamide, C-carboxylate, O-carboxylate, N-thiocarbamate, O-thiocarbamate, urea, thiourea, N-carbamate, O-carbamate, C-amide, N-amide, guanyl, guanidine and hydrazine. The cycloalkyl group can be an end group, as this phrase is defined hereinabove, wherein it is attached to a single adjacent atom, or a linking group, as this phrase is defined hereinabove, connecting two or more moieties at two or more positions thereof.

The term "heteroalicyclic" describes a monocyclic or fused ring group having in the ring(s) one or more atoms such as nitrogen, oxygen and sulfur. The rings may also have one or more double bonds. However, the rings do not have a completely conjugated pi-electron system. Representative examples are piperidine, piperazine, tetrahydrofuran, tetrahydropyrane, morpholino, oxalidine, and the like. The heteroalicyclic may be substituted or unsubstituted. Substituted heteroalicyclic may have one or more substituents, whereby each substituent group can independently be, for example, hydroxyalkyl, trihaloalkyl, cycloalkyl, alkenyl, alkynyl, aryl, heteroaryl, heteroalicyclic, amine, halide, sulfonate, sulfoxide, phosphonate, hydroxy, alkoxy, aryloxy, thiohydroxy, thioalkoxy, thioaryloxy, cyano, nitro, azo, sulfonamide, C-carboxylate, O-carboxylate, N-thiocarbamate, O-thiocarbamate, urea, thiourea, O-carbamate, N-carbamate, C-amide, N-amide, guanyl, guanidine and hydrazine. The heteroalicyclic group can be an end group, as this phrase is defined hereinabove, where it is attached to a single adjacent atom, or a linking group, as this phrase is defined hereinabove, connecting two or more moieties at two or more positions thereof.

The term "aryl" describes an all-carbon monocyclic or fused-ring polycyclic (i.e., rings which share adjacent pairs of carbon atoms) groups having a completely conjugated pi-electron system. The aryl group may be substituted or unsubstituted. Substituted aryl may have one or more substituents, whereby each substituent group can independently be, for example, hydroxyalkyl, trihaloalkyl, cycloalkyl, alkenyl, alkynyl, aryl, heteroaryl, heteroalicyclic, amine, halide, sulfonate, sulfoxide, phosphonate, hydroxy, alkoxy, aryloxy, thiohydroxy, thioalkoxy, thioaryloxy, cyano, nitro, azo, sulfonamide, C-carboxylate, O-carboxylate, N-thiocarbamate, O-thiocarbamate, urea, thiourea, N-carbamate, O-carbamate, C-amide, N-amide, guanyl, guanidine and hydrazine. The aryl group can be an end group, as this term is defined hereinabove, wherein it is attached to a single adjacent atom, or a linking group, as this term is defined hereinabove, connecting two or more moieties at two or more positions thereof.

The term "heteroaryl" describes a monocyclic or fused ring (i.e., rings which share an adjacent pair of atoms) group having in the ring(s) one or more atoms, such as, for example, nitrogen, oxygen and sulfur and, in addition, having a completely conjugated pi-electron system. Examples, without limitation, of heteroaryl groups include pyrrole, furan, thiophene, imidazole, oxazole, thiazole, pyrazole, pyridine, pyrimidine, quinoline, isoquinoline and purine. The heteroaryl group may be substituted or unsubstituted. Substituted heteroaryl may have one or more substituents, whereby each substituent group can independently be, for example, hydroxyalkyl, trihaloalkyl, cycloalkyl, alkenyl, alkynyl, aryl, heteroaryl, heteroalicyclic, amine, halide, sulfonate, sulfoxide, phosphonate, hydroxy, alkoxy, aryloxy, thiohydroxy, thioalkoxy, thioaryloxy, cyano, nitro, azo, sulfonamide, C-carboxylate, O-carboxylate, N-thiocarbamate, O-thiocarbamate, urea, thiourea, O-carbamate, N-carbamate, C-amide, N-amide, guanyl, guanidine and hydrazine. The heteroaryl group can be an end group, as this phrase is defined hereinabove, where it is attached to a single adjacent atom, or a linking group, as this phrase is defined hereinabove, connecting two or more moieties at two or more positions thereof. Representative examples are pyridine, pyrrole, oxazole, indole, purine and the like.

The term "halide" and "halo" describes fluorine, chlorine, bromine or iodine.

The term "haloalkyl" describes an alkyl group as defined above, further substituted by one or more halide.

The term "sulfate" describes a —O—S(=O)$_2$—ORx end group, as this term is defined hereinabove, or an —O—S(=O)$_2$—O— linking group, as these phrases are defined hereinabove, where Rx is as defined hereinabove.

The term "thiosulfate" describes a —O—S(=S)(=O)—ORx end group or a —O—S(=S)(=O)—O— linking group, as these phrases are defined hereinabove, where Rx is as defined hereinabove.

The term "sulfite" describes an —O—S(=O)—O—Rx end group or a —O—S(=O)—O— group linking group, as these phrases are defined hereinabove, where Rx' is as defined hereinabove.

The term "thiosulfite" describes a —O—S(=S)—O—Rx end group or an —O—S(=S)—O— group linking group, as these phrases are defined hereinabove, where Rx is as defined hereinabove.

The term "sulfinate" describes a —S(=O)—ORx end group or an —S(=O)—O— group linking group, as these phrases are defined hereinabove, where Rx is as defined hereinabove.

The term "sulfoxide" or "sulfinyl" describes a —S(=O)Rx end group or an —S(=O)— linking group, as these phrases are defined hereinabove, where Rx is as defined hereinabove.

The term "sulfonate" describes a —S(=O)$_2$-Rx end group or an —S(=O)$_2$— linking group, as these phrases are defined hereinabove, where Rx is as defined herein.

The term "S-sulfonamide" describes a —S(=O)$_2$—NRxRy end group or a —S(=O)$_2$—NRx- linking group, as these phrases are defined hereinabove, with Rx and Ry as defined herein.

The term "N-sulfonamide" describes an RxS(=O)$_2$—NRy- end group or a —S(=O)$_2$—NRx- linking group, as these phrases are defined hereinabove, where Rx and Ry are as defined herein.

The term "disulfide" refers to a —S—SRx end group or a —S—S— linking group, as these phrases are defined hereinabove, where Rx is as defined herein.

The term "phosphonate" describes a —P(=O)(ORx)(ORy) end group or a —P(=O)(ORx)(O)— linking group, as these phrases are defined hereinabove, with Rx and Ry as defined herein.

The term "thiophosphonate" describes a —P(=S)(ORx)(ORy) end group or a —P(=S)(ORx)(O)— linking group, as these phrases are defined hereinabove, with Rx and Ry as defined herein.

The term "phosphinyl" describes a —PRxRy end group or a —PRx- linking group, as these phrases are defined hereinabove, with Rx and Ry as defined hereinabove.

The term "phosphine oxide" describes a —P(=O)(Rx)(Ry) end group or a —P(=O)(Rx)- linking group, as these phrases are defined hereinabove, with Rx and Ry as defined herein.

The term "phosphine sulfide" describes a —P(=S)(Rx)(Ry) end group or a —P(=S)(Rx)- linking group, as these phrases are defined hereinabove, with Rx and Ry as defined herein.

The term "phosphite" describes an —O—PRx(=O)(ORy) end group or an —O— PRx(=OXO)— linking group, as these phrases are defined hereinabove, with Rx and Ry as defined herein.

The term "carbonyl" or "carbonate" as used herein, describes a —C(=O)—Rx end group or a —C(=O)— linking group, as these phrases are defined hereinabove, with Rx as defined herein.

The term "thiocarbonyl" as used herein, describes a —C(=S)—Rx end group or a —C(=S)— linking group, as these phrases are defined hereinabove, with Rx as defined herein.

The term "oxo" as used herein, describes a (=O) group, wherein an oxygen atom is linked by a double bond to the atom (e.g., carbon atom) at the indicated position.

The term "thiooxo" as used herein, describes a (=S) group, wherein a sulfur atom is linked by a double bond to the atom (e.g., carbon atom) at the indicated position.

The term "oxime" describes a =N—OH end group or a =N—O— linking group, as these phrases are defined hereinabove.

The term "hydroxyl" describes a —OH group.

The term "alkoxy" describes both an —O-alkyl and an —O-cycloalkyl group, as defined herein.

The term "aryloxy" describes both an —O-aryl and an —O-heteroaryl group, as defined herein.

The term "thiohydroxy" describes a —SH group.

The term "thioalkoxy" describes both a —S-alkyl group, and a —S-cycloalkyl group, as defined herein.

The term "thioaryloxy" describes both a —S-aryl and a —S-heteroaryl group, as defined herein.

The "hydroxyalkyl" is also referred to herein as "alcohol", and describes an alkyl, as defined herein, substituted by a hydroxy group. In some embodiments, the alkyl is substituted by hydroxy at a distal position with respect to its attachment point.

The term "cyano" describes a —C≡N group.

The term "isocyanate" describes an —N=C=O group.

The term "isothiocyanate" describes an —N=C=S group.

The term "nitro" describes an —NO$_2$ group.

The term "acyl halide" describes a —(C=O)Rz group wherein Rz is halide, as defined hereinabove.

The term "azo" or "diazo" describes an —N=NRx end group or an —N=N— linking group, as these phrases are defined hereinabove, with Rx as defined hereinabove.

The term "peroxo" describes an —O—ORx end group or an —O—O— linking group, as these phrases are defined hereinabove, with Rx as defined hereinabove.

The term "carboxylate" as used herein encompasses C-carboxylate and O— carboxylate.

The term "C-carboxylate" describes a —C(=O)—ORx end group or a —C(=O)—O— linking group, as these phrases are defined hereinabove, where Rx is as defined herein.

The term "O-carboxylate" describes a —OC(=O)Rx end group or a —OC(=O)— linking group, as these phrases are defined hereinabove, where Rx is as defined herein.

A carboxylate can be linear or cyclic. When cyclic, Rx and the carbon atom are linked together to form a ring, in C-carboxylate, and this group is also referred to as lactone. Alternatively, Rx and O are linked together to form a ring in O-carboxylate. Cyclic carboxylates can function as a linking group, for example, when an atom in the formed ring is linked to another group.

The term "thiocarboxylate" as used herein encompasses C-thiocarboxylate and O-thiocarboxylate.

The term "C-thiocarboxylate" describes a —C(=S)—ORx end group or a —C(=S)—O— linking group, as these phrases are defined hereinabove, where Rx is as defined herein.

The term "O-thiocarboxylate" describes a —OC(=S)Rx end group or a —OC(=S)— linking group, as these phrases are defined hereinabove, where Rx is as defined herein.

A thiocarboxylate can be linear or cyclic. When cyclic, Rx and the carbon atom are linked together to form a ring, in C-thiocarboxylate, and this group is also referred to as thiolactone. Alternatively, Rx and O are linked together to form a ring in O— thiocarboxylate. Cyclic thiocarboxylates can function as a linking group, for example, when an atom in the formed ring is linked to another group.

The term "carbamate" as used herein encompasses N-carbamate and O— carbamate.

The term "N-carbamate" describes an RyOC(=O)—NRx- end group or a —OC(=O)-NRx- linking group, as these phrases are defined hereinabove, with Rx and Ry as defined herein.

The term "O-carbamate" describes an —OC(=O)—NRxRy end group or an —OC(=O)—NRx- linking group, as these phrases are defined hereinabove, with Rx and Ry as defined herein.

A carbamate can be linear or cyclic. When cyclic, Rx and the carbon atom are linked together to form a ring, in O-carbamate. Alternatively, Rx and O are linked together to form a ring in N-carbamate. Cyclic carbamates can function as a linking group, for example, when an atom in the formed ring is linked to another group.

The term "carbamate" as used herein encompasses N-carbamate and O-carbamate.

The term "thiocarbamate" as used herein encompasses N-thiocarbamate and O-thiocarbamate.

The term "O-thiocarbamate" describes a —OC(=S)—NRxRy end group or a —OC(=S)—NRx- linking group, as these phrases are defined hereinabove, with Rx and Ry as defined herein.

The term "N-thiocarbamate" describes an RyOC(=S)NRx- end group or a —OC(=S)NRx- linking group, as these phrases are defined hereinabove, with Rx and Ry as defined herein.

Thiocarbamates can be linear or cyclic, as described herein for carbamates.

The term "dithiocarbamate" as used herein encompasses S-dithiocarbamate and N-dithiocarbamate.

The term "S-dithiocarbamate" describes a —SC(=S)—NRxRy end group or a —SC(=S)NRx- linking group, as these phrases are defined hereinabove, with Rx and Ry as defined herein.

The term "N-dithiocarbamate" describes an RySC(=S)NRx- end group or a —SC(=S)NRx- linking group, as these phrases are defined hereinabove, with Rx and Ry as defined herein.

The term "urea", which is also referred to herein as "ureido", describes a —NRxC(=O)—NRyRq end group or a —NRxC(=O)—NRy- linking group, as these phrases are defined hereinabove, where Rz and Ry are as defined herein and Rq is as defined herein for Rx and Ry.

The term "thiourea", which is also referred to herein as "thioureido", describes a —NRx-C(=S)—NRyRq end group or a —NRx-C(=S)—NRy- linking group, with Rx, Ry and Rq as defined herein.

The term "amide" as used herein encompasses C-amide and N-amide.

The term "C-amide" describes a —C(=O)—NRxRy end group or a —C(=O)-NRx- linking group, as these phrases are defined hereinabove, where Rx and Ry are as defined herein.

The term "N-amide" describes a RxC(=O)—NRy- end group or a RxC(=O)—N— linking group, as these phrases are defined hereinabove, where Rx and Ry are as defined herein.

An amide can be linear or cyclic. When cyclic, Rx and the carbon atom are linked together to form a ring, in C-amide, and this group is also referred to as lactam. Cyclic amides can function as a linking group, for example, when an atom in the formed ring is linked to another group.

The term "guanyl" describes a RxRyNC(=N)— end group or a -RxNC(=N)— linking group, as these phrases are defined hereinabove, where Rx and Ry are as defined herein.

The term "guanidine" describes a -RxNC(=N)—NRyRq end group or a —RxNC(=N)—NRy- linking group, as these phrases are defined hereinabove, where Rx, Ry and Rq are as defined herein.

The term "hydrazine" describes a —NRx-NRyRq end group or a —NRx-NRy- linking group, as these phrases are defined hereinabove, with Rx, Ry, and Rq as defined herein.

As used herein, the term "hydrazide" describes a —C(=O)—NRx-NRyRq end group or a —C(=O)—NRx-NRy- linking group, as these phrases are defined hereinabove, where Rx, Ry and Rq are as defined herein.

As used herein, the term "thiohydrazide" describes a —C(=S)—NRx-NRyRq end group or a —C(=S)—NRx-NRy- linking group, as these phrases are defined hereinabove, where Rx, Ry and Rq are as defined herein.

Herein, the term "hydrocarbon" describes an organic moiety that includes, as its basic skeleton, a chain of carbon atoms, also referred to herein as a backbone chain, substituted mainly by hydrogen atoms. The hydrocarbon can be saturated or unsaturated, linear or branched, and can be comprised of aliphatic, alicyclic and/or aromatic moieties, and can optionally be substituted by one or more substituents (other than hydrogen).

The hydrocarbon moiety can optionally be interrupted by one or more heteroatoms, including, without limitation, one or more oxygen, nitrogen (substituted or unsubstituted, as defined herein for —NR₁— or for an amine linking group) and/or sulfur atoms.

The number of carbon atoms in a hydrocarbon moiety can range from 2 to 20, and is preferably lower, e.g., from 1 to 10, or from 1 to 6, or from 1 to 4. A hydrocarbon can be a linking group or an end group.

In some embodiments of any of the embodiments described herein relating to a hydrocarbon, the hydrocarbon is not interrupted by any heteroatom, nor does it comprise heteroatoms in its backbone chain, and can be an alkylene chain, or be comprised of alkyls, cycloalkyls, aryls, alkaryls, aralkyls, alkenes and/or alkynes, as defined herein, covalently attached to one another in any order.

In some of these embodiments, the hydrocarbon is an alkylene chain.

The term "alkylene" describes a saturated aliphatic hydrocarbon group, as this term is defined herein. This term is also referred to herein as "alkyl".

The alkylene can be substituted or unsubstituted, as defined herein for alkyl.

In some embodiments, when a hydrocarbon as described herein is interrupted by one or more heteroatoms, the hydrocarbon can comprises one or more alkylene glycol groups (units).

As used herein, the term "alkylene glycol" describes a —[(CRxRy)$_z$-O]$_y$-Rq end group or a -[(CRxRy)$_z$-O]$_y$— linking group, with Rx, Ry and Rq being as defined herein, and with z being an integer of from 1 to 10, preferably, 2-6, more preferably 2 or 3, and y being an integer of 1 or more. Preferably Rx and Ry are both hydrogen. When z is 2 and y is 1, this group is ethylene glycol. When z is 3 and y is 1, this group is propylene glycol.

When y is greater than 4, the alkylene glycol is referred to herein as poly(alkylene glycol). In some embodiments of the present invention, a poly(alkylene glycol) group or moiety can have from 1 to 20 repeating alkylene glycol units, such that z is 1 to 20, preferably 1-10, more preferably 1-8, or as further defined hereinabove.

In some embodiments, a hydrocarbon moiety as described herein is a poly(alkylene glycol) moiety.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Various embodiments and aspects of the present invention as delineated hereinabove and as claimed in the claims section below find experimental support in the following examples.

EXAMPLES

Reference is now made to the following examples, which together with the above descriptions illustrate some embodiments of the invention in a non limiting fashion.

Example 1

Exemplary Mono-Functional and Multi-Functional Curable Materials

Table 1 below presents exemplary hydrophilic monofunctional curable materials that were used for forming the tested formulations.

TABLE 1

| Chemical/Commercial name | Cas No. | Structure |
|---|---|---|
| (3-Acrylamidopropyl) trimethylammonium chloride (DMAPAA-Q) | 45021-77-0 | |
| N-[3-(Dimethylamino) propyl]acrylamide (DMAPAA) | 3845-76-9 | |
| N,N-Dimethylacrylamide (DMAA) | 2680-03-7 | |
| N,N-Diethylacrylamide (DEAA) | 2675-94-7 | |
| SR256 Di(ethylene glycol) ethyl ether acrylate (EOEOEA) | 7328-17-8 | |
| SR550 Poly(ethylene glycol) methyl ether methacrylate (MPEG350A) | 26915-72-0 | n = 8 |
| SR551 Poly(ethylene glycol) methyl ether acrylate (MPEG350A) | 32171-39-4 | n = 8; n = 8 |
| [2-(acyloyloxy)ethyl] trimethylammonium chloride (Adamquat MC 80) | 44992-01-0 | |
| 3-Trimethylammoniumpropyl methacrylamide chloride (aq. Solution) (MAPTAC) | 51410-72-1 | |
| 2-Trimethylammoniumethyl methacrylate chloride (aq. Solution) (TMAEMC) | 5039-78-1 | |

TABLE 1-continued

| Chemical/Commercial name | Cas No. | Structure |
|---|---|---|
| Polyethylene glycol (6) monoacrylate MPEG260 LD | 32171-39-4 | n = 6 |
| Acryloyl morpholine (ACMO ™) | 5117-12-4 | |
| 2-Hydroxyethyl acrylate (HEA) | 818-61-1 | |
| Ethoxylated O-phenylphenol acrylate (A-LEN-10) | 72009-86-0 | |
| Methoxy Polyethylene Glycol 400 Acrylate (EO 9 mol) (AM-90G) | 32171-39-4 | n = 9 |
| Methoxy Polyethylene Glycol 550 Acrylate (EO 13 mol) (AM-130G) | 32171-39-4 | n = 13 |
| Polyethylene Glycol phenyl ether acrylate (AM-20GY) | 56641-05-5 | |
| N-Hydroxyethyl acrylamide (HEAA) | 7646-67-5 | |
| Polyethylene glycol (6) monoacrylate (PEA-6) | 26403-58-7 | |
| Vinyl Phosphonic Acid (85% wt. in H$_2$O) | 1746-03-8 | |
| Acrylic Acid | 79-10-7 | |

Table 2 below presents exemplary multi-functional curable materials that were used for forming the tested formulations.

TABLE 2

| Chemical/Commercial name | Cas No. | Structure |
| --- | --- | --- |
| N,N'-Methylenebis-(acrylamide) (MBA) | 110-26-9 | |
| 3-(Acryloyloxy)-2-hydroxypropyl methacrylate (AMAHP) | 1709-71-3 | |
| SR444D Pentaerythritol triacrylate (PETIA) | 3524-68-3 | |
| SR368 Tris (2-hydroxyethyl) isocyanurate triacrylate (THEICTA) | 40220-08-4 | |
| Glycerol 1,3-diglycerolate diacrylate (GDGDA) | 60453-84-1 | |
| SR355 Di-Trimethylolpropane tetraacrylate (DiTMPTTA) | 94108-97-1 | |
| SR259 Polyethylene glycol (200) diacrylate (PEG200DA) | 26570-48-9 | n = 4 |

TABLE 2-continued
| Chemical/Commercial name | Cas No. | Structure |
|---|---|---|
| SR610 Polyethylene glycol (600) diacrylate (PEG600DA) | 26570-48-9 | |
| SR833S Tricyclodecane dimethanol diacrylate (TCDDMDA) | 42594-17-2 | |
| SR508 Dipropylene glycol diacrylate (DPGDA) | 57472-68-1 | |
| SR415 Ethoxylated (20) trimethylolpropane triacrylate (TMP20EOTA) | 28961-43-5 | |
| SR399 Di-Pentaerythritol Pentaacrylate (DiPEPA) | 60506-81-2 | |
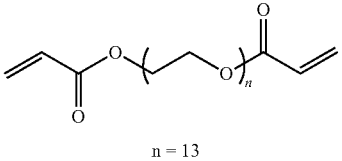

Example 2

Breakability Measurements

Procedure I (Molds):

Formulations comprising various combinations of one or more mono-functional curable material(s), one or more multi-functional curable material(s), and optionally one or more non-curable component(s), as presented in Table 3 below, were prepared by mixing all components, in the presence of a photoinitiator and optionally other additives, as described herein, at room temperature, optionally by heating in an oven at 50-85° C., for achieving homogeneity and for degassing. The formulations were placed in a rectangular shaped mold, 63 mm (x)×12.7 mm (y)×3.2 mm (z) dimensions (about 3 grams of each formulation), and subjected to UV irradiation for a period of about 120 minutes. The obtained cured material was then immersed in tap water (100 mL) at room temperature, without stirring, and the time period between t=0, immersion of the sample in water, to the time point at which all the cured material breaks (which is equal to a cleaning time as described herein) was recorded.

Procedure II (3D-Printed Objects):

Formulations comprising various combinations of one or more mono-functional curable material(s), one or more multi-functional curable material(s), and optionally one or more non-curable component(s), as presented in Table 4 below, a photoinitiator and optionally other additives, as described herein, were prepared by mixing all the components at room temperature, and optionally heating the mixture in an oven at 50-85° C. The obtained formulations were used to print, in matte, a 50-mm size owl, using, for example, CeroClear as a model material, and a bounding box size of 50 mm×23 mm×25.8 mm, about 15 grams, of a support material), as exemplified in FIG. 2A, on a Connex500 and Objet3Connex system. The printed object was then immersed in a 3 L-glass filled with tap water and cleaning times were recorded. Cleaning time is measured from t=0, immersion of the printed object in water, until reaction reaches to an end (complete removal of the cured support material from the owl's surface). FIG. 2A presents the owl object upon cleaning.

For comparison, reference support formulations, which are made from curable materials other than those described herein, were used to print the same owl object and the cleaning time was measured, according to the procedure described hereinabove.

Results:

The data obtained in the mold experiments clearly show that almost all tested formulations decompose by breaking into small pieces upon static immersion in water in less than 2 hours.

The data obtained in the 3D-printing experiments is presented in Table 3 below. These data further support the efficient decomposition of the formulations described herein upon immersion in water.

FIG. 2B presents comparative data of two reference formulations, denoted as Type 1 and Type 2 Support Reference formulations, and two formulations according to exemplary embodiments of the present invention, as shown in Tables 4 and 5 below, respectively.

TABLE 4

| (Type 1 formulation) | |
|---|---|
| Component | Wt % |
| A positively charged monoacrylate | 50-80 |
| Hydroxy Acryl amide | 5-20 |
| A difunctional acrylate | 5-15 |
| a photoinitiator | 0.5-2.0 |

TABLE 5

| (Type 2 formulation) | |
|---|---|
| Component | Wt % |
| MPEG monoacrylate | 50-80 |
| trifunctional acrylate | 5-15 |
| Polyol | 5-15 |
| alkyl diol | 5-10 |
| a photoinitiator | 0.5-2.0 |

Type I formulation comprises, as an exemplary mono-functional curable material, a positively charged monoacrylate, and Type II formulation comprises, as an exemplary mono-functional monomer, an alkoxy-terminated alkylene glycol methacrylate. As shown in FIG. 2B, the formulations described herein supersede other support formulations.

TABLE 3

| Mono-functional curable material(s) | | | | | | Multi-functional curable material(s) | | Non-curable material(s) | | | | Time (min.) |
|---|---|---|---|---|---|---|---|---|---|---|---|---|
| Chemical substance | % wt. | Chemical substance | % wt | Chemical substance | % wt. | Chemical substance | % wt. | Chemical substance | % wt. | Chemical substance | % wt. | |
| MPEG-mono-acrylate | 40-60 | | | | | Multifunctional acrylate | 5-10 | Polyol | 10-40 | | | 100-200 |
| MPEG-mono-acrylate | 50-70 | Urethane monoacrylate oligomer | 5-10 | | | Multifunctional acrylate | 5-10 | Polyol | 10-20 | Alkyl diol | 3-10 | 60-100 |
| MPEG-mono-acrylate | 20-30 | Acryl amide | 0-3 | MPEG-mono methacrylate | 20-30 | Multifunctional acrylate | 5-10 | Polyol | 20-40 | | | 70-120 |
| Charged mono-acrylate | 55-85 | Hydroxy Acryl amide | 0-10 | Cyclic Acryl Amide | 0-30 | Di-functional acrylate | 10-40 | $H_2O$ | 0-5 | | | 30-60 |
| Charged mono-acrylate | 30-50 | | | | | Di-functional acrylate | 10-20 | $H_2O$ + Polyol | 3-5 3-5 | Alkyl diol | 20-40 | 40-70 |

Example 3

Water Absorption Measurements

Samples made of formulations containing various combinations of mono-functional and multi-functional curable materials as described herein (see, for example Tables 1 and 2 herein), were prepared in molds as described in Example 2 hereinabove, using a rectangular flat mold 40×40 mm and 3-5 mm thickness.

Cured samples were immersed in water (100 ml) for a time period of 48-72 hours. Samples broke into particles, and following measurements were made on the particles.

Using Filter Discs (MUNKTELL, Grade 1289) of 12 micron pore size, the particles obtained upon breakage were collected from the water, and, to ensure removal of water between particles, a vacuum pump with Buchner funnel was used.

The particles were weighted on a calibrated analytical scale, and were thereafter left to dry under ambient conditions for 96 hours.

The obtained dry particles were thereafter weighted on a calibrated analytical scale.

The water absorption ratio was defined as the weight % difference compared to the original weight of the samples (i) upon immersion in water; and (ii) upon immersion in water and drying.

The data obtained for various formulations of AM-130G and SR-399, each having a different degree of cross-linking (DOC) calculated theoretically as described hereinabove, is presented in Table 6 below.

It is noted that cured materials obtained from formulations containing non-reactive (non-curable) materials lose weight after immersion in water due to leaching of the non-reactive component.

TABLE 6

| AM-130G (wt %) | SR399 (wt %) | Degree of Crosslinking | water uptake wt % after immersion | water uptake wt % after drying | Comment |
|---|---|---|---|---|---|
| 99 | 1 | 6.51% | 349% | 98% | Swells breakable |
| 95 | 5 | 26.6% | 125% | 28% | |
| 90 | 10 | 43.4% | 90% | −5% | |
| 85 | 15 | 54.9% | 87% | 3% | |
| 80 | 20 | 63.3% | 45% | −1% | |
| 75 | 25 | 69.7% | 31% | −1% | |
| 50 | 50 | 87.3% | 6% | −3% | Does not break |

Example 4

Particles Size Measurements

Samples are prepared in mold, as described in Example 3 hereinabove, or by 3D inkjet printing, as described in Example 2 hereinabove.

The obtained samples were immersed in 100 ml water for a time period of from 48 hours to 96 hours.

Using Filter Discs (MUNKTELL, Grade 1289) of 12 micron pore size, the particles obtained upon breakage were collected from the water, and were left to dry under ambient conditions for a time period of at least 72 hours. Particles were then weighted on a calibrated analytical scale.

For particles size measurements, five different Mesh sizes were used in a single test, arranged from 4 mm mesh size to 250 microns (4-2-1-0.5-0.25)

Particles were dispersed above the largest mesh, and the mesh column was shaked to avoid particles settling due to clogging. Particles were collected from each mesh by flipping into a fabric/aluminum foil, and weighted. Each weight fraction was then divided by the total weight.

It is noted that some variations occurred due to weight loss and/or contamination during measurements.

The obtained data is presented in FIGS. 3A-C, for printed samples made of AG-130G and SR368 (FIG. 3A), SR355 (FIG. 3B) and SR399 (FIG. 3C), for various degrees of crosslinking, and in FIGS. 4A-B for mold preparations of AG-130G and SR399 (FIG. 4A) and of DMAPAA-Q and SR444D (FIG. 4B).

Table 7 below presents the weight percents of each component (mMo for the mono-functional curable material; mCL for the multi-functional curable material), the molar ratio therebetween (nMo/CL) and the respective DOC.

TABLE 7

| Mo | CL | mMo (wt %) | mCL (wt %) | n [Mo/CL] | DOC (%) |
|---|---|---|---|---|---|
| AM-130 | SR-399 | 97.30% | 0.74% | 104.50 | 5 |
| AM-130 | SR-399 | 93.52% | 4.52% | 16.50 | 25 |
| AM-130 | SR-399 | 87.64% | 10.40% | 6.72 | 45 |
| AM-130 | SR-399 | 77.23% | 20.81% | 2.96 | 65 |
| AM-130 | SR-355 | 97.10% | 0.94% | 76.00 | 5 |
| AM-130 | SR-355 | 92.40% | 5.64% | 12.00 | 25 |
| AM-130 | SR-355 | 85.26% | 12.78% | 4.89 | 45 |
| AM-130 | SR-355 | 73.16% | 24.88% | 2.15 | 65 |
| AM-130 | SR-368 | 96.95% | 1.09% | 57.00 | 5 |
| AM-130 | SR-368 | 91.50% | 6.54% | 9.00 | 25 |
| AM-130 | SR-368 | 83.41% | 14.62% | 3.67 | 45 |
| AM-130 | SR-368 | 70.13% | 27.91% | 1.62 | 65 |
| AM-130 | SR-444D | 97.38% | 0.66% | 66.50 | 5 |
| AM-130 | SR-444D | 93.99% | 4.05% | 10.50 | 25 |
| AM-130 | SR-444D | 88.65% | 9.39% | 4.28 | 45 |
| AM-130 | SR-444D | 79.04% | 18.99% | 1.88 | 65 |
| AM-130 | SR-833S | 96.86% | 1.18% | 38.00 | 5 |
| AM-130 | SR-833S | 91.03% | 7.01% | 6.00 | 25 |
| AM-130 | SR-833S | 82.46% | 15.58% | 2.44 | 45 |
| AM-130 | SR-833S | 68.61% | 29.43% | 1.08 | 65 |
| AM-130 | SR-508 | 97.06% | 0.98% | 38.00 | 5 |
| AM-130 | SR-508 | 92.16% | 5.88% | 6.00 | 25 |
| AM-130 | SR-508 | 84.76% | 13.28% | 2.44 | 45 |
| AM-130 | SR-508 | 72.32% | 25.72% | 1.08 | 65 |
| AM-130 | GDGDA | 96.69% | 1.35% | 38.00 | 5 |
| AM-130 | GDGDA | 90.10% | 7.94% | 6.00 | 25 |
| AM-130 | GDGDA | 80.60% | 17.44% | 2.44 | 45 |
| AM-130 | GDGDA | 65.75% | 32.29% | 1.08 | 65 |
| AM-130 | SR-415 | 95.06% | 2.98% | 57.00 | 5 |
| AM-130 | SR-415 | 81.80% | 16.24% | 9.00 | 25 |
| AM-130 | SR-415 | 65.91% | 32.13% | 3.67 | 45 |
| AM-130 | SR-415 | 46.54% | 51.50% | 1.62 | 65 |
| AM-130 | SR-610 | 95.27% | 2.77% | 38.00 | 5 |
| AM-130 | SR-610 | 82.81% | 15.23% | 6.00 | 25 |
| AM-130 | SR-610 | 67.55% | 30.49% | 2.44 | 45 |
| AM-130 | SR-610 | 48.43% | 49.61% | 1.08 | 65 |
| AM-130 | SR-259 | 96.87% | 1.17% | 38.00 | 5 |
| AM-130 | SR-259 | 91.07% | 6.97% | 6.00 | 25 |
| AM-130 | SR-259 | 82.54% | 15.50% | 2.44 | 45 |
| AM-130 | SR-259 | 68.74% | 29.30% | 1.08 | 65 |

As shown, at degree of crosslinking higher than 10%, or higher than 20%, e.g., from 40 to about 70%, most particles have a size lower than 4 mm, and more than 50% of the particles have a size of 2 mm or less.

These data further show that by selecting a combination of a mono-functional curable material and a multi-functional curable material and the molar ratio therebetween, a degree of cross-linking can be determined. The degree of cross linking determined the particles size distribution, such that by manipulating parameters that affect the DOC, the particles size distribution obtained upon breakage of the cured material can be pre-determined.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting.

What is claimed is:

1. A curable formulation comprising at least one mono-functional curable material and at least one multi-functional curable material, said mono-functional and multi-functional curable materials and a concentration ratio thereof being selected such that a cured material formed upon exposing the formulation to a curing energy breaks into particles upon immersion in an aqueous solution,
wherein:
said cured material breaks upon said immersion into particles having a size ranging from 1 micron to 100 mm; and/or
said cured material features a degree of cross linking that ranges from 10 to 80%; and/or
said cured material has a swelling capacity of from 10 to 300% by weight; and/or
a 3-gram cube made of said cured material breaks upon static immersion in water in less than 10 hours.

2. The curable formulation of claim 1, wherein said at least one mono-functional curable material is represented by Formula I:

wherein:
Ra is hydrogen, alkyl or cycloalkyl; and
Z is represented by X-L-Y,
wherein:
X is selected from C(=O), C(=O)—NR$_1$, C(=O)—O, P(=O)—(OR$_2$)—O or is absent;
Y is selected from O$^-$M$^+$, OR$_3$, NR$_4$R$_5$ or N$^+$R$_4$R$_5$R$_6$Q;
L is a hydrocarbon moiety of 1 to 40 atoms in length, optionally interrupted by one or more heteroatom(s), said heteroatoms being independently selected from O, S and NR$_2$, or is absent;
Q is a negatively charged counter ion;
M$^+$ is a positively charged counter ion;
R$_1$ and R$_2$ are each independently selected from hydrogen, alkyl and cycloalkyl;
R$_3$ is selected from hydrogen, alkyl, cycloalkyl and aryl; and
R$_4$, R$_5$ and R$_6$ are each independently selected from hydrogen, alkyl and cycloalkyl, or, alternatively, R$_4$ and R$_5$ form a cyclic ring.

3. The curable formulation of claim 2, wherein Y is N$^+$R$_4$R$_5$R$_6$Q.

4. The curable formulation of claim 3, wherein L is a hydrocarbon moiety of 1 to 4 carbon atoms in length.

5. The curable formulation of claim 2, wherein Y is NR$_4$R$_5$.

6. The curable formulation of claim 2, wherein Y is OR$_3$.

7. The curable formulation of claim 6, wherein L is a hydrocarbon moiety interrupted by one or more heteroatom(s).

8. The curable formulation of claim 1, wherein said mono-functional curable material forms a polymeric (cured) material featuring:
a water uptake of at least 200%; and/or
a hydrophilic lipophilic balance, determined according to Davies method, of at least 10; and/or
a water solubility of at least 50 weight percents.

9. The curable formulation of claim 1, wherein said at least one multi-functional curable material:
(i) forms a polymer featuring a Tg higher than 20° C.; and/or
(iii) is represented by Formula II:

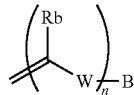

wherein:
Rb is hydrogen, alkyl or cycloalkyl;
n is an integer of from 2 to 10, representing a number of polymerizable groups =C(Rb)—W—;
W in each of said polymerizable groups is independently selected from C(=O)—O, C(=O)—NR$_8$, and C(=O) or is absent; and
B is a hydrocarbon moiety of 1 to 20 atoms, interrupted and/or substituted by at least one hydrogen donor-containing group.

10. The curable formulation of claim 9, wherein said multi-functional curable material forms a polymer featuring said Tg higher than 20° C..

11. The curable formulation of claim 10, wherein said multi-functional curable material is represented by Formula II.

12. The curable formulation of claim 11, wherein said hydrogen donor-containing group is selected from oxygen, hydroxy, hydroxyalkyl, amine, aminoalkyl, thiol, and thio-alkyl.

13. The curable formulation of claim 1, wherein a concentration of said at least one mono-functional curable material ranges from 40 to 90, weight percents of the total weight of the formulation.

14. The curable formulation of claim 1, wherein a concentration of said multi-functional curable material ranges from 5 to 60 weight percents of the total weight of the formulation.

15. The curable formulation of claim 1, further comprising at least one non-curable material.

16. The curable formulation of claim 15, wherein said at least one non-curable material comprises a water-miscible polymer.

17. The curable formulation of claim 1, wherein at least 50% of said particles have a size lower than 10 mm.

18. A method of fabricating a three-dimensional model object, the method comprising dispensing a building material so as to sequentially form a plurality of layers in a configured pattern corresponding to the shape of the object, wherein said building material comprises the curable formulation of claim 1.

19. The method of claim 18, wherein said building material comprises a modeling material formulation and a support material formulation, said support material formulation comprising said curable formulation.

20. The method of claim 19, further comprising, subsequent to said dispensing, exposing the building material to curing energy, to thereby obtain a printed objected which comprises a cured support material formed of said curable formulation; and removing said cured support material, to thereby obtain the three-dimensional model object, said removing comprises contacting said cured support material with water.

21. The method of claim 20, wherein said contacting comprises static immersion of said cured support material in said water.

22. A three-dimensional object fabricated by the method of claim 18.

\* \* \* \* \*